US009508748B2

(12) United States Patent
Park et al.

(10) Patent No.: US 9,508,748 B2
(45) Date of Patent: Nov. 29, 2016

(54) THIN FILM TRANSISTOR DISPLAY PANEL AND LIQUID CRYSTAL DISPLAY

(71) Applicant: SAMSUNG DISPLAY CO., LTD., Yongin, Gyeonggi-Do (KR)

(72) Inventors: Kee-Bum Park, Cheonan-si (KR); Kyung Ho Kim, Seongnam-si (KR)

(73) Assignee: SAMSUNG DISPLAY CO., LTD. (KR)

(*) Notice: Subject to any disclaimer, the term of this patent is extended or adjusted under 35 U.S.C. 154(b) by 0 days.

(21) Appl. No.: 14/469,271

(22) Filed: Aug. 26, 2014

(65) Prior Publication Data
US 2015/0198851 A1 Jul. 16, 2015

(30) Foreign Application Priority Data
Jan. 13, 2014 (KR) .................. 10-2014-0004040

(51) Int. Cl.
  *G02F 1/136* (2006.01)
  *G09G 3/36* (2006.01)
  *H01L 27/12* (2006.01)
  *G02F 1/1343* (2006.01)
  *G02F 1/1362* (2006.01)

(52) U.S. Cl.
  CPC ....... *H01L 27/124* (2013.01); *G02F 1/134309* (2013.01); *G02F 2001/134345* (2013.01); *G02F 2001/136218* (2013.01)

(58) Field of Classification Search
  CPC .................. G02F 1/136286; G02F 1/136227; G02F 1/133345; G02F 1/133512; G02F 1/136277; G02F 1/1368; G02F 1/134309; G02F 2001/136218; G02F 2001/134345; H01L 27/124
  See application file for complete search history.

(56) References Cited

U.S. PATENT DOCUMENTS

| 2005/0127359 A1* | 6/2005 | Son ...................... H01L 27/124 257/59 |
| 2007/0120797 A1* | 5/2007 | Lin ................... G02F 1/133555 345/92 |
| 2013/0093658 A1* | 4/2013 | Park .................... G02F 1/13452 345/92 |

FOREIGN PATENT DOCUMENTS

| KR | 100585872 B1 | 5/2006 |
| KR | 100724957 B1 | 5/2007 |
| KR | 1020070080475 A | 8/2007 |
| KR | 1020090016341 A | 2/2009 |
| KR | 1020090131596 A | 12/2009 |
| KR | 101180719 B1 | 9/2012 |

* cited by examiner

*Primary Examiner* — Donald Raleigh
(74) *Attorney, Agent, or Firm* — Cantor Colburn LLP

(57) ABSTRACT

A thin film transistor display panel includes: a substrate; a gate line and a storage electrode line on the substrate; a gate insulating layer on the gate line; a semiconductor layer on the gate insulating layer; a data line, a drain electrode and a divided-voltage reference voltage line on the semiconductor layer; a passivation layer covering the data line, the drain electrode and the divided-voltage reference voltage line; and a first sub-pixel electrode and a second sub-pixel electrode electrically connected to the drain electrode through a contact hole defined in the passivation layer and including a plurality of pixel branch electrodes, where the divided-voltage reference voltage line divides a first or second sub-pixel area, which is defined by the first or second sub-pixel electrode, into two regions, and each of the two regions has three sides defined by the divided-voltage reference voltage line and an open side.

20 Claims, 17 Drawing Sheets

THIN FILM TRANSISTOR DISPLAY PANEL AND LIQUID CRYSTAL DISPLAY

This application claims priority to Korean Patent Application No. 10-2014-0004040 filed on Jan. 13, 2014, and all the benefits accruing therefrom under 35 U.S.C. §119, the content of which in its entirety is herein incorporated by reference.

BACKGROUND (a) Field

Exemplary embodiments of the invention relate to a thin film transistor display panel and a liquid crystal display including the thin film transistor.

(b) Description of the Related Art

A liquid crystal display, which is one of the most widely used types of flat panel display, typically includes two sheets of display units with field generating electrodes such as a pixel electrode, a common electrode, and the like, and a liquid crystal layer interposed therebetween. The liquid crystal display device generates an electric field in the liquid crystal layer by applying voltages to the field generating electrodes, and determines the direction of liquid crystal molecules of the liquid crystal layer by the generated electric field, thus controlling polarization of incident light to display images.

As the liquid crystal display is widely used as a display device of a television receiver, a size of a screen is being enlarged. When the size of the liquid crystal display is enlarged, a difference in the visual field increases based on a case in which a viewer views a center portion of the screen and a case in which the viewer views both left and right ends of the screen.

To compensate for such difference in the visual field, a display device in a curved shape may be provided by bending the display device to be in a concave shape or a convex shape. The display device may be provided as a portrait type having a longer vertical length than a horizontal length and bent in a vertical direction based on the viewer, and may be provided in a landscape type having a shorter vertical length than a horizontal length and bent in a horizontal direction, based on the viewer.

SUMMARY

In a liquid crystal display formed in a curved shape by bending the liquid crystal display, front end stress is applied to a substrate positioned to be inward of a curved surface between the two substrates. Therefore, in such a liquid crystal display, texture may occur due to misalignment of elements in the upper and lower substrates.

Exemplary embodiments of the invention provide a thin film transistor display panel, in which texture that may occurs when bent to provide a curved panel is reduced by placing a pixel electrode and a stem of a divided-voltage reference voltage line in a horizontal direction, a manufacturing method of the thin film transistor display panel, and a liquid crystal display including the thin film transistor display panel.

An exemplary embodiment of the invention provides a thin film transistor display panel including: a first substrate; a gate line disposed on the first substrate; a storage electrode line disposed on the first substrate; a gate insulating layer disposed on the gate line; a semiconductor layer disposed on the gate insulating layer; a data line disposed on the semiconductor layer; a drain electrode connected to the data line and disposed on the semiconductor layer; a divided-voltage reference voltage line disposed on the semiconductor layer; a passivation layer which covers the data line, the drain electrode and the divided-voltage reference voltage line, where a first contact hole and a second contact hole, which expose the drain electrode, are defined through the passivation layer; a first sub-pixel electrode electrically connected to the drain electrode through the first contact hole and including a plurality of pixel branch electrodes; and a second sub-pixel electrode electrically connected to the drain electrode through the second contact hole and including a plurality of pixel branch electrodes, where the first sub-pixel electrode and the first contact hole are in an upper region in a pixel area with respect to the gate line, the second sub-pixel electrode and the second contact hole are in a lower region in the pixel area with respect to the gate line, the divided-voltage reference voltage line divides a first sub-pixel area of the pixel area, in which the first sub-pixel electrode is disposed, into two regions, and each of the two regions of the first sub-pixel area has three sides defined by the divided-voltage reference voltage line and an open side, and the divided-voltage reference voltage line divides a second sub-pixel area of the pixel area, in which the second sub-pixel electrode is disposed, into two regions and each of the two regions of the second sub-pixel area has three sides defined by the divided-voltage reference voltage line and an open side.

In an exemplary embodiment, the pixel branch electrodes of each of the first sub-pixel electrode and second sub-pixel electrode may include a first horizontal stem and a second horizontal stem extending substantially in a horizontal direction, and a plurality of minute branches extending in an oblique direction from the first and second horizontal stems.

In an exemplary embodiment, the open sides of the two regions of the first sub-pixel area may be opposite to each other, and the open sides of the two regions of the second sub-pixel area may be opposite to each other.

In an exemplary embodiment, a minute branch extending from the first horizontal stem of the first sub-pixel electrode may be connected to a minute branch extending from the second horizontal stem of the first sub-pixel electrode, and a minute branch extending toward the gate line from the second horizontal stem of the first sub-pixel electrode may be connected to an expansion of the first sub-pixel electrode and receive a voltage from the drain electrode through the first contact hole.

In an exemplary embodiment, a minute branch extending from the first horizontal stem of the second sub-pixel electrode may be connected to a minute branch extending from the second horizontal stem of the second sub-pixel electrode, and a minute branch extending toward the gate line from the first horizontal stem of the second sub-pixel electrode may be connected to an expansion of the second sub-pixel electrode and receive the voltage from the drain electrode through the second contact hole.

In an exemplary embodiment, the pixel branch electrodes of the first sub-pixel electrode may further include a first perpendicular stem substantially perpendicular to the first horizontal stem of the first sub-pixel electrode and connected to an end of the first horizontal stem of the first sub-pixel electrode, and a second perpendicular stem substantially perpendicular to the second horizontal stem of the first sub-pixel electrode and connected to an end of the second horizontal stem of the first sub-pixel electrode, and a position of the first perpendicular stem in the first sub-pixel area is opposite to a position of the second perpendicular stem in the first sub-pixel area.

In an exemplary embodiment, the pixel branch electrodes of the second sub-pixel electrode may further include a first perpendicular stem substantially perpendicular to the first horizontal stem and connected to an end of the first horizontal stem of the second sub-pixel electrode, a second perpendicular stem substantially perpendicular to the second horizontal stem of the second sub-pixel electrode and connected to an end of the second horizontal stem of the second sub-pixel electrode, and a position of the first perpendicular stem in the second sub-pixel area is opposite to a position of the second perpendicular stem in the second sub-pixel area.

In an exemplary embodiment, the first perpendicular stem and the second perpendicular stem of the first sub-pixel electrode may overlap the divided-voltage reference voltage line, and the divided-voltage reference voltage line may be disposed between a minute branch extending from the first horizontal stem of the first sub-pixel electrode and a minute branch extending from the second horizontal stem of the first sub-pixel electrode.

In an exemplary embodiment, the first perpendicular stem and the second perpendicular stem of the second sub-pixel electrode may overlap the divided-voltage reference voltage line, and the divided-voltage reference voltage line may be disposed between a minute branch extending from the first horizontal stem of the first sub-pixel electrode and a minute branch extending from the second horizontal stem of the first sub-pixel electrode.

In an exemplary embodiment, a portion of the divided-voltage reference voltage line in the first sub-pixel area may include: a first horizontal unit, a second horizontal unit and a third horizontal unit which extend substantially in the horizontal direction in the first sub-pixel electrode region; a first perpendicular unit connected to an end of the first horizontal unit and an end of the second horizontal unit at a first side; and a second perpendicular unit connected to an end of the second horizontal unit and an end of the third horizontal unit at a second side, where the first side and the second side may be opposite to each other. In such an embodiment, a portion of the divided-voltage reference voltage line in the second sub-pixel area may include: a first horizontal unit, a second horizontal unit and a third horizontal unit which extend substantially in the horizontal direction in the second sub-pixel electrode region; a first perpendicular unit connected to an end of the first horizontal unit and an end of the second horizontal unit at the first side; and a second perpendicular unit connected to an end of the second horizontal unit and an end of the third horizontal unit at the second side, where the first perpendicular unit and the second perpendicular unit may be opposite to each other.

In an exemplary embodiment, the first perpendicular unit of the divided-voltage reference voltage line may overlap the first perpendicular stem of the first sub-pixel electrode or the second sub-pixel electrode, and the second perpendicular unit of the divided-voltage reference voltage line may overlap the second perpendicular unit of the first sub-pixel electrode or the second sub-pixel electrode.

In an exemplary embodiment, a portion of the storage electrode line formed in the first sub-pixel area may have a square-like ring shape surrounding four sides of the first sub-pixel area.

In an exemplary embodiment, a portion of the storage electrode line in the second sub-pixel electrode region has a shape substantially the same as a shape of the divided-voltage reference voltage line in the second sub-pixel electrode region, the portion of the storage electrode line in the second sub-pixel area may overlap the divided-voltage reference voltage line in the second sub-pixel area, and the portion of the storage electrode line in the second sub-pixel area may be electrically insulated from the divided-voltage reference voltage line in the second sub-pixel area.

In an exemplary embodiment, the thin film transistor display panel may further include a shield electrode disposed in a same layer as the first and second sub-pixel electrodes, and the shield electrode may extend substantially in a perpendicular direction along the pixel area and include a perpendicular unit overlapping the data line and a horizontal unit disposed between the first sub-pixel electrode and the second sub-pixel electrode.

In an exemplary embodiment, four domains are defined in each of the first and second sub-pixel areas.

Another exemplary embodiment of the invention provides a liquid crystal display including: a first substrate; a gate line disposed on the first substrate; a storage electrode line disposed on the first substrate; a gate insulating layer disposed on the gate line; a semiconductor layer disposed on the gate insulating layer; a data line disposed on the semiconductor layer; a drain electrode connected to the data line and disposed on the semiconductor layer; a divided-voltage reference voltage line disposed on the semiconductor layer; a passivation layer which covers the data line, the drain electrode and the divided-voltage reference voltage line, where a first contact hole and a second contact hole, which expose the drain electrode, are defined through the passivation layer; a first sub-pixel electrode electrically connected to the drain electrode through the first contact hole, and including a plurality of pixel branch electrodes; a second sub-pixel electrode electrically connected to the drain electrode through the second contact hole, and including a plurality of pixel branch electrodes; a second substrate disposed opposite to the first substrate; a common electrode disposed on the second substrate; and a liquid crystal layer disposed between the first substrate and the second substrate, where the first sub-pixel electrode and the first contact hole are in an upper region of a pixel area with respect to the gate line, the second sub-pixel electrode and the second contact hole are in a lower region of the pixel area with respect to the gate line, the pixel branch electrodes of each of the first sub-pixel electrode and the second sub-pixel electrode includes: a first horizontal stem extending substantially in a horizontal direction; a second horizontal stem extending substantially in the horizontal direction; and a plurality of minute branches extending in an oblique direction from the first and second horizontal stems, the divided-voltage reference voltage line divides a first sub-pixel area of the pixel area, in which the first sub-pixel electrode is disposed, into two regions, each of the two regions of the first sub-pixel area has three sides defined by the divided-voltage reference voltage line and an open side, open sides of the two regions of the first sub-pixel area are opposite to each other, the divided-voltage reference voltage line divides a second sub-pixel area of the pixel area, in which the second sub-pixel electrode is disposed, into two regions, each of the two regions of the second sub-pixel area has three sides defined by the divided-voltage reference voltage line and an open side, and open sides of the two regions of the second sun-pixel area are opposite to each other.

In an exemplary embodiment, a minute branch extending from the first horizontal stem of the first sub-pixel electrode may be connected to a minute branch extending from the second horizontal stem of the first sub-pixel electrode, a minute branch extending toward the gate line from the second horizontal stem of the first sub-pixel electrode may be connected to an expansion of the first sub-pixel electrode and receive a voltage from the drain electrode through the first contact hole, a minute branch extending from the first horizontal stem of the second sub-pixel electrode may be connected to a minute branch extending from the second horizontal stem of the second sub-pixel electrode, and a minute branch extending toward the gate line from the first horizontal stem of the second sub-pixel electrode may be connected to an expansion of the second sub-pixel electrode and receive a voltage from the drain electrode through the second contact hole.

In an exemplary embodiment, the pixel branch electrodes of each of the first sub-pixel electrode and the second sub-pixel electrode may further include: a first perpendicular stem substantially perpendicular to the first horizontal stem thereof and connected to an end of the first horizontal stem thereof, a second perpendicular stem substantially perpendicular to the second horizontal stem thereof and connected to an end of the second horizontal stem thereof, and a position of the first perpendicular stem in the first or second sub-pixel area may be opposite a position of the second perpendicular stem therein.

In an exemplary embodiment, the liquid crystal display may further include a shield electrode disposed in a same layer as the first and second sub-pixel electrodes, where the shield electrode may extend in the perpendicular direction along the pixel area, and the shield electrode may include: a perpendicular unit which overlaps the data line; and a horizontal unit disposed between the first sub-pixel electrode and the second sub-pixel electrode.

In an exemplary embodiment, the liquid crystal display may further include a black matrix which exposes the first and second sub-pixel areas and a region of the second substrate facing the shield electrode.

In exemplary embodiments of the invention, the pixel electrode and the stem of the divided-voltage reference voltage line are disposed in a horizontal direction to improve texture that may occur when bent to be configured as a curved panel.

BRIEF DESCRIPTION OF THE DRAWINGS

The above and other features of the invention will become more apparent by describing in detailed exemplary embodiments thereof with reference to the accompanying drawings, in which.

DETAILED DESCRIPTION OF THE EMBODIMENTS

Figure 1:
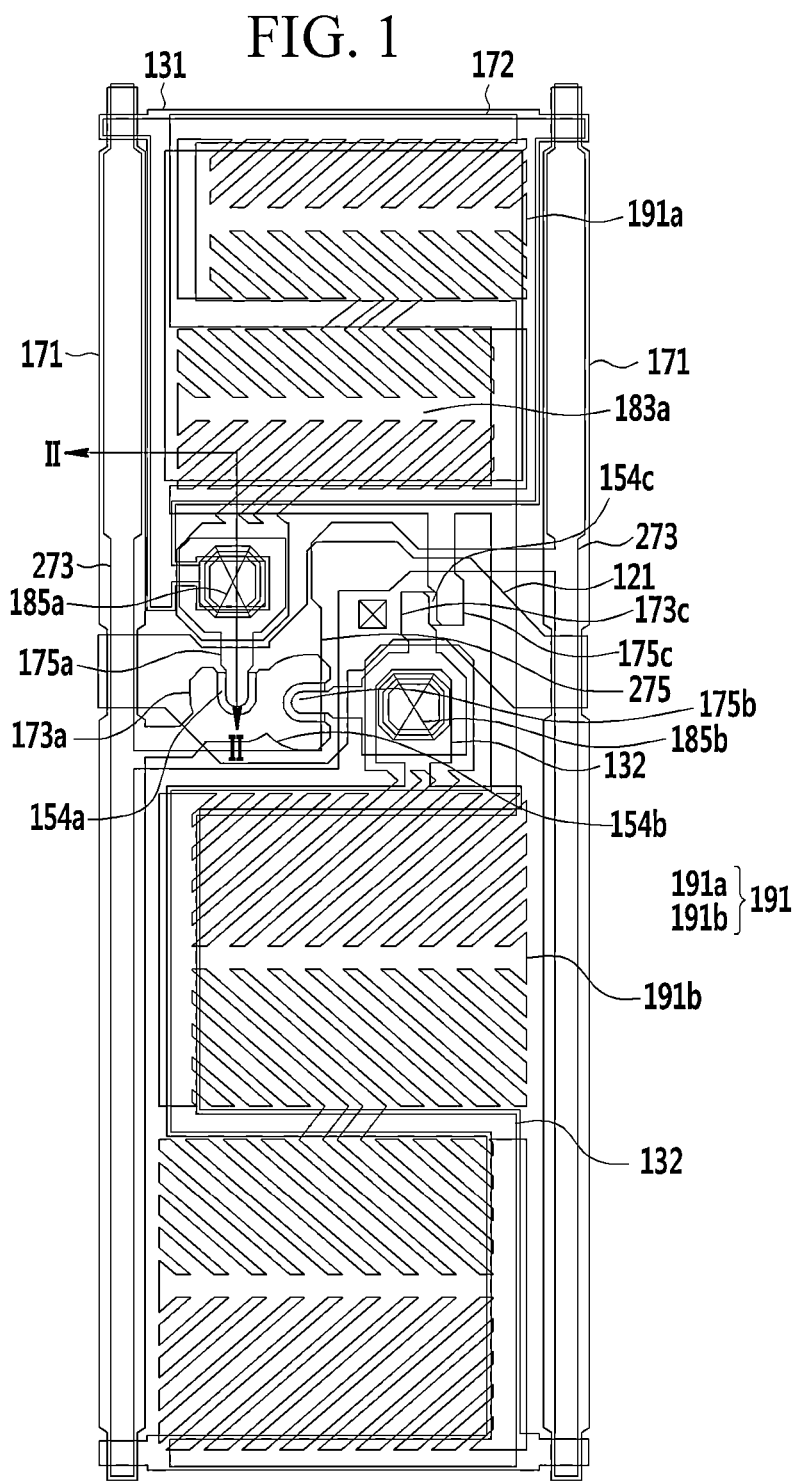
FIG. 1 is a plan view of an exemplary embodiment of a thin film transistor display panel according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, exemplary embodiments of a thin film transistor display panel and exemplary embodiments of a manufacturing method thereof, according to the invention, will now be described with reference to accompanying drawings.

An exemplary embodiment of a thin film transistor display panel according to the invention will now be described with reference to FIG. 1 to FIG. 4.

Figure 2:
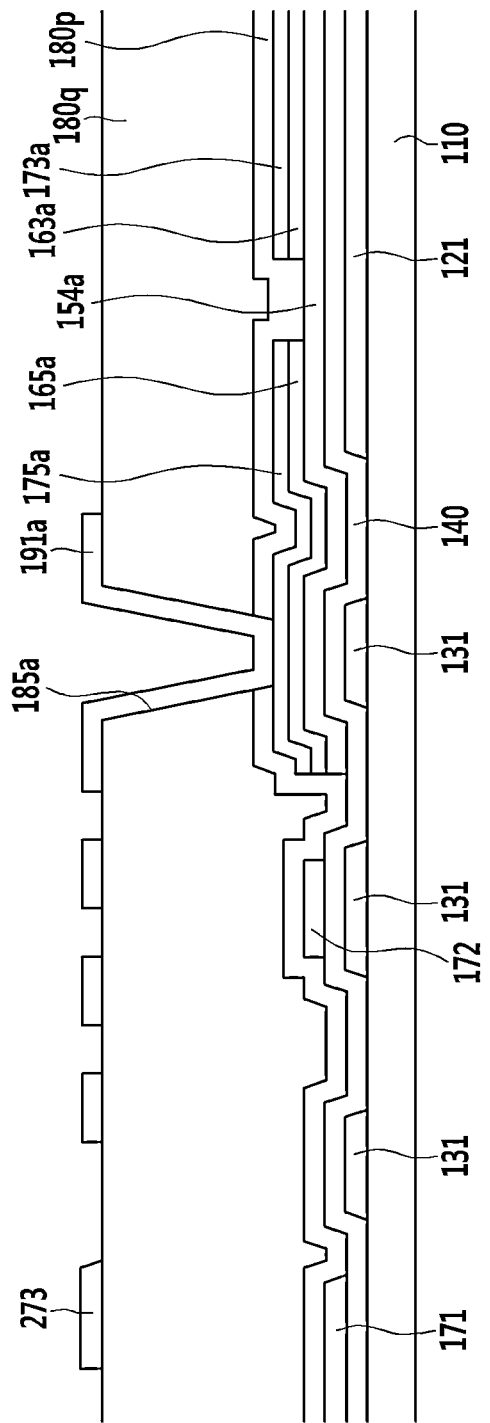
FIG. 2 is a cross-sectional view taken along line II-II of the thin film transistor display panel of FIG. 1.
Figure 3:
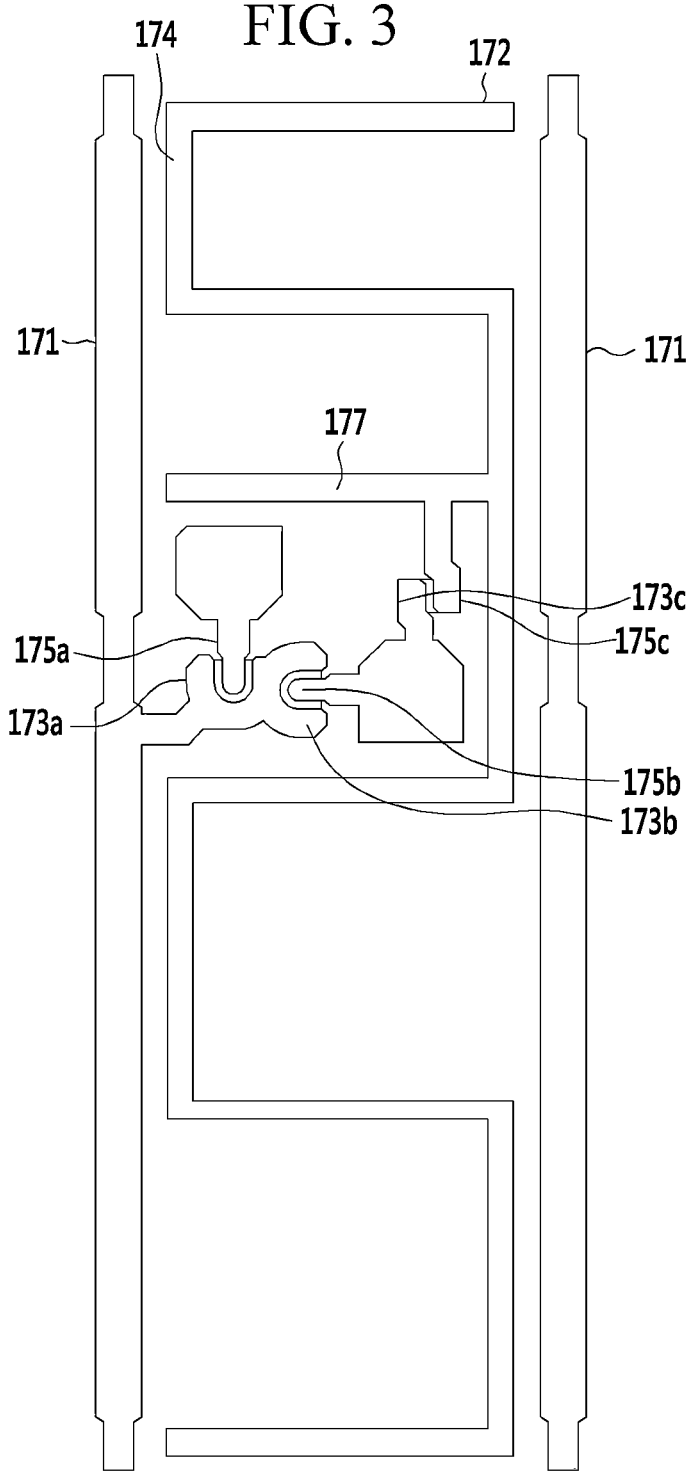
FIG. 3 is a plan view of a data line and a divided-voltage reference voltage line of an exemplary embodiment of a thin film transistor display panel according to the invention.
Figure 4:
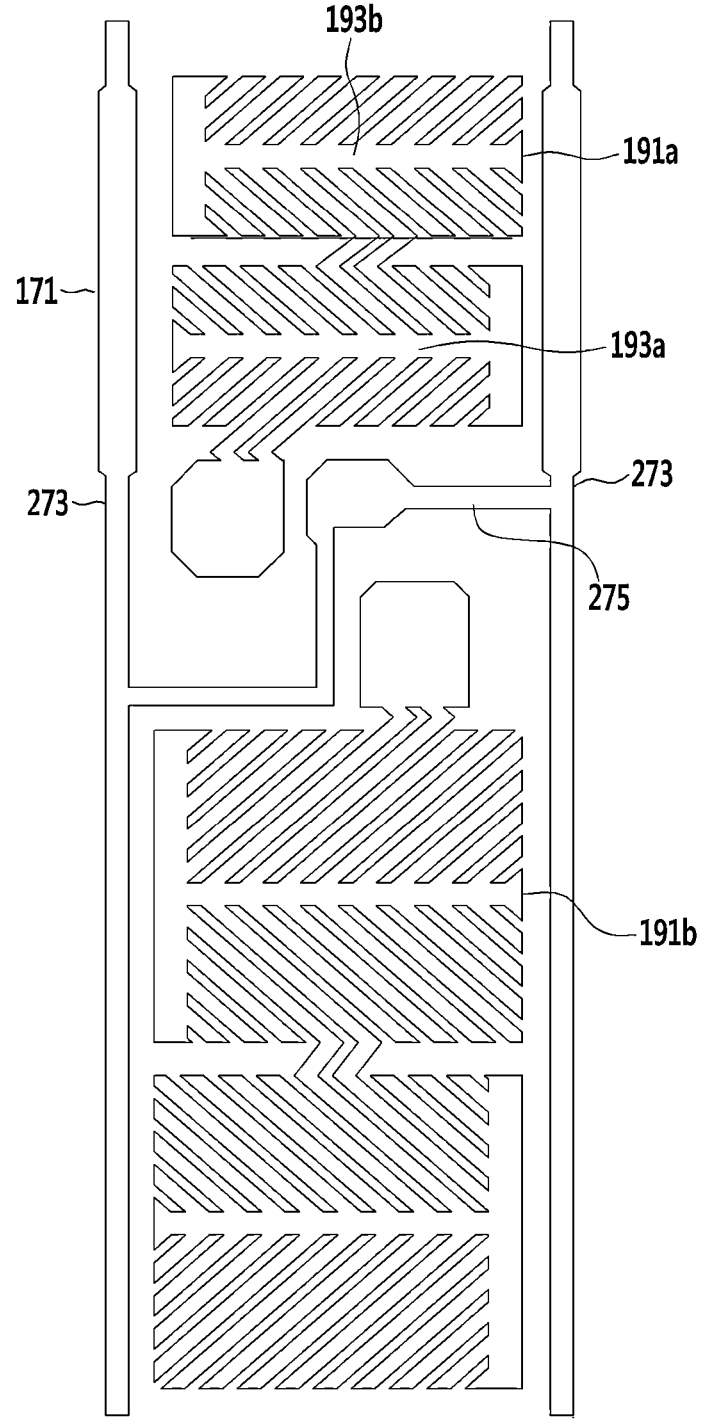
FIG. 4 is a plan view of a pixel electrode and a shield electrode of an exemplary embodiment of a thin film transistor display panel according to the invention.

FIG. 1 is a plan view of an exemplary embodiment of a thin film transistor display panel according to the invention. FIG. 2 is a cross-sectional view taken along line II-II of the thin film transistor display panel of FIG. 1. FIG. 3 is a plan view of a data line 171 and a divided-voltage reference voltage line 172 of an exemplary embodiment of a thin film transistor display panel according to the invention. FIG. 4 is a plan view of a pixel electrode 191 and a shield electrode 273 of an exemplary embodiment of a thin film transistor display panel according to the invention.

In an exemplary embodiment of the thin film transistor display panel, as shown in FIGS. 1 and 2, a gate conductor including a gate line 121 and storage electrode lines 131 and 132 is disposed on an insulation substrate 110 including a transparent material such as glass or plastic, for example.

The gate line 121 includes a gate electrode and a wide end portion (not shown) that may be connected to another layer or an external driving circuit. The gate line 121 may include aluminum (Al) or an aluminum-based metal such as an aluminum alloy, silver (Ag) or a silver-based metal such as a silver alloy, copper (Cu) or a copper-based metal such as a copper alloy, molybdenum (Mo) or a molybdenum-based metal such as a molybdenum alloy, chromium (Cr), tantalum (Ta), or titanium (Ti). In one exemplary embodiment, for example, the gate line 121 may have a multilayer structure including at least two conductive layers having different physical properties from each other.

The gate line 121 extends substantially in a horizontal direction in a single pixel area. An upper region of the gate line 121 defines a first sub-pixel area for expressing a high grayscale, and a lower region of the gate line 121 defines a second sub-pixel area for expressing a low grayscale.

The storage electrode lines 131 and 132 may include or be made of the same material as the gate line 121 and may be provided or formed by a concurrent process with a process of providing the gate line 121.

The storage electrode line 131 at the upper region of the gate line 121 may have a shape that surrounds the first sub-pixel area in a quadrangular manner, e.g., a square-like ring shape. An upper horizontal unit of the storage electrode line 131 at the upper region of the gate line 121 may extend from a pixel area substantially in the horizontal direction, and may be connected to another layer or an external driving circuit.

The storage electrode line 132 at the lower region of the gate line 121 may have a shape similar to a shape of the number 5 in the second sub-pixel area. In such an embodiment, the storage electrode line 132 includes a plurality of horizontal units and a plurality of perpendicular units for connecting the horizontal units on an edge, and the perpendicular units connect one opposing side ends of the horizontal units. In an exemplary embodiment, the horizontal units may be substantially parallel to each other, and the perpendicular units may be substantially perpendicular to the horizontal units. In an exemplary embodiment, as shown in FIG. 1, a first horizontal unit and a second horizontal unit may be connected to a first perpendicular unit at left side ends thereof, and the second horizontal unit and a third horizontal unit may be connected to a second perpendicular unit at right side ends thereof. The third horizontal unit provided at a lowermost end of the storage electrode line 132 may extend from the second sub-pixel area and may be connected to another layer or an external driving circuit. The third horizontal unit of the storage electrode line 132 may define the upper horizontal unit of the storage electrode line 131 at the upper region in another pixel area provided thereunder. In an exemplary embodiment, a single horizontal unit, which extends substantially in the horizontal direction and connected to another layer or an external driving circuit, is disposed between two adjacent pixel areas in a vertical direction.

In an exemplary embodiment, as shown in FIG. 2, a gate insulating layer 140 is disposed on the gate conductor.

In such an embodiment, a first semiconductor 154a, a second semiconductor 154b and a third semiconductor 154c are disposed on the gate insulating layer 140.

A plurality of ohmic contacts, e.g., ohmic contacts 163a and 165a of the first semiconductor 154a, are disposed on the semiconductors 154a, 154b, and 154c.

A data conductor including a data line 171 and a divided-voltage reference voltage line 172 is disposed on the ohmic contacts 163a and 165a and the gate insulating layer 140

The data conductor, and the semiconductors and the ohmic contacts disposed below the data conductor, may be simultaneously provided or formed using a same mask or a single mask.

FIG. 3 shows a data conductor of an exemplary embodiment of a thin film transistor display panel according to the invention.

In an exemplary embodiment, the data conductor includes a data line 171, a first drain electrode 175a, a second drain electrode 175b, and a divided-voltage reference voltage line 172.

The data line 171 extends substantially in a perpendicular direction along a pixel area, and includes a first source electrode 173a and a second source electrode 173b.

In such an embodiment, the data conductor includes the divided-voltage reference voltage line 172 including a third drain electrode 175c.

Referring to FIG. 3, in an exemplary embodiment, the divided-voltage reference voltage line 172 includes a plurality of horizontal units and a plurality of perpendicular units for connecting the horizontal units, and has a shape similar to the shape of the number 5. In such an embodiment, the divided-voltage reference voltage line 172 includes a plurality of horizontals unit and a plurality of perpendicular units for connecting them, and the perpendicular units connect one side ends of the horizontal units that are parallel. In an exemplary embodiment, the horizontal units may be substantially parallel to each other, and the perpendicular units may be substantially perpendicular to the horizontal units. In such an embodiment, a first horizontal unit and a second horizontal unit may be connected to a first perpendicular unit at left side ends thereof, and the second horizontal unit and a third horizontal unit may be connected to a second perpendicular unit at right side ends thereof.

The divided-voltage reference voltage line 172 may have portions having a shape similar to the shape of the number 5 in the first sub-pixel area and the second sub-pixel area, respectively. In an exemplary embodiment, the second sub-pixel area may be longer than the first sub-pixel area, and a length of the divided-voltage reference voltage line 172 in the second sub-pixel area may be longer than the divided-voltage reference voltage line 172 in the first sub-pixel area.

In an alternative exemplary embodiment, the divided-voltage reference voltage line 172 may have a reversed shape of the shape similar to the shape of the number 5 shown in FIG. 3 in which the right and the left sides are reversed in the horizontal direction. In one exemplary embodiment, for example, the divided-voltage reference voltage line 172 may have a shape similar to a shape of the number 2 that is similar a shape in which the right and the left sides of the shape similar to the number 5 is reversed in the horizontal direction, in each of the first sub-pixel area and the second sub-pixel area.

Regarding the divided-voltage reference voltage line 172 in the first sub-pixel area, the horizontal unit 177 that defines a lowermost portion thereof may include a portion extending downwardly to define the third drain electrode 175c.

The first gate electrode 124a, the first source electrode 173a and the first drain electrode 175a collectively define a first thin film transistor (Qa shown in FIG. 6) together with the first semiconductor island 154a, and a channel of the first thin film transistor is formed on the semiconductor 154a between the first source electrode 173a and the first drain electrode 175a. Similarly, the second gate electrode 124b, the second source electrode 173b and the second drain electrode 175b collectively define a second thin film transistor (Qb shown in FIG. 6) together with the second semiconductor island 154b, and a channel of the second thin film transistor is formed on the semiconductor 154b between the second source electrode 173b and the second drain electrode 175b, while the third gate electrode 124c, a third source electrode 173c and the third drain electrode 175c collectively define a third thin film transistor (Qc shown in FIG. 6) together with the third semiconductor island 154c, and a channel of the third thin film transistor is formed on the semiconductor 154c between the third source electrode 173c and the third drain electrode 175c.

The second drain electrode 175b is connected to the third source electrode 173c and includes an expanded portion having a wide area.

A first passivation layer 180p is disposed on the data conductor and exposed portions of the semiconductors 154a, 154b and 154c. The first passivation layer 180p may include an inorganic insulating layer such as a silicon nitride or a silicon oxide. In an exemplary embodiment, a second passivation layer 180q may be a color filter, and the first passivation layer 180p may effectively prevent inflow of a pigment of a second passivation layer 180q into the exposed portions of the semiconductors 154a, 154b and 154c.

In an exemplary embodiment, as shown in FIG. 2, the second passivation layer 180q is disposed on the first passivation layer 180p. In an alternative exemplary embodiment, the second passivation layer 180q may be omitted. In an exemplary embodiment, the second passivation layer 180q may be a color filter. In such an embodiment, where the second passivation layer 180q is a color filter, the second passivation layer 180q may uniquely express one of primary colors which may be red, green and blue, or yellow, cyan and magenta. In an exemplary embodiment, the color filter may further include a color filter for expressing a mixed color of the primary colors or white.

A first contact hole 185a and a second contact hole 185b for exposing the first drain electrode 175a and the second drain electrode 175b are defined through the first passivation layer 180p and the second passivation layer 180q.

A plurality of pixel electrodes 191 is disposed on the second passivation layer 180q. The respective pixel electrodes 191 are spaced apart from each other with a gate line 121 therebetween, and each pixel electrode 191 may include a first sub-pixel electrode 191a and a second sub-pixel electrode 191b neighboring each other in the vertical direction or a column direction with respect to the gate line 121. In an exemplary embodiment, the pixel electrode 191 may be formed with a transparent material such as indium tin oxide ("ITO") and indium zinc oxide ("IZO, for example, or a reflective metal such as aluminum, silver, chromium, or an alloy thereof, for example.

The shield electrode 273 including a same material as the pixel electrode 191 is disposed in the same layer as the pixel electrode 191 on the second passivation layer 180q. The pixel electrode 191 and the shield electrode 273 may be simultaneously provided or formed by a same process.

FIG. 4 shows shapes of a pixel electrode 191 and a shield electrode 273 of an exemplary embodiment of a thin film transistor display panel according to the invention.

The shapes of the pixel electrode 191 and the shield electrode 273 will now be described in detail with reference to FIG. 4.

The shield electrode 273 will be described first. The shield electrode 273 includes perpendicular units overlapping portions of the data line 171 disposed in sides of a pixel area and a horizontal unit 275 for connecting neighboring perpendicular units. The shield electrode 273 may further include an expansion in a center of the horizontal unit 275 of the shield electrode.

A voltage applied to the shield electrode 273 is substantially the same as a voltage applied to the common electrode (not shown).

Therefore, in such an embodiment, electric field is not generated between the shield electrode 273 and the common electrode, and alignment of liquid crystal molecules of a liquid crystal layer disposed between the shield electrode 273 and the common electrode are not changed. Accordingly, in such an embodiment, a portion of the liquid crystal layer between the shield electrode and the common electrode is in a black state, such that the portion of the liquid crystal may function as a black matrix. Accordingly, the black matrix, which is conventionally provided to the upper panel may be omitted from the liquid crystal display including such an embodiment of the thin film transistor display panel according to the invention. In such an embodiment, the portion of the liquid crystal layer between the shield electrode and the common electrode functions as a black matrix.

The pixel electrode 191 will now be described. The pixel electrodes 191 are spaced apart from each other with the gate line 121 therebetween, and include the first sub-pixel electrode 191a and the second sub-pixel electrode 191b neighboring in the column direction with respect to the gate line 121.

The first sub-pixel electrode 191a includes horizontal stems extending substantially in the horizontal direction and a plurality of minute branches extending in an oblique direction, e.g. a diagonal direction, from opposing sides of the horizontal stems. The first sub-pixel electrode 191a includes two horizontal stems 193a and 193b, minute branches of which extends in different directions from each other.

Referring to FIG. 4, the first sub-pixel electrode 191a further includes a first perpendicular stem that is substantially perpendicular to the first horizontal stem at a right side of the first sub-pixel electrode 191a, and the minute branches extends from the first horizontal stem 193a obliquely in a direction away from the first perpendicular unit, e.g., an upper left or lower left direction.

In such an embodiment, the first sub-pixel electrode 191a further includes a second perpendicular stem that is substantially perpendicular to the second horizontal stem 193b at a left side of the first sub-pixel electrode 191a, and the minute branch extends from the second horizontal stem 193b obliquely in a direction away from the second perpendicular unit, e.g., an upper right or lower right direction.

However, the positions of the first and second perpendicular stems are not limited to the positions described above. In an alternative exemplary embodiment, the first horizontal stem may include a first perpendicular stem at the left side, and the second horizontal stem may include a second perpendicular stem at the right side.

In an exemplary embodiment, the first sub-pixel electrode 191a may further include minute branches extending from the first and second perpendicular stems. A part of the minute branch extending from the first horizontal stem 193a is connected to the minute branch extending from the second horizontal stem 193b. Further, a part of the minute branch extending from the first horizontal stem is connected to the expansion of the first sub-pixel electrode and receives a voltage from the drain electrode through the first contact hole 185a.

The second sub-pixel electrode 191b has a shape substantially the same as the shape of the first sub-pixel electrode 191a. In such an embodiment, the second sub-pixel electrode 191b includes two horizontal stems that extend substantially in the horizontal direction, two perpendicular stems and a plurality of minute branches that extends in the diagonal direction from the horizontal or perpendicular stems. The second sub-pixel electrode 191b includes two horizontal stems of which minute branches proceed in different directions. The horizontal stems, the perpendicular stems and the minute branches of the second sub-pixel electrode 191b are substantially the same as the horizontal stems, the perpendicular stems and the minute branches of the first sub-pixel electrode 191a, and any repetitive detailed description thereof will be omitted.

Referring to FIG. 3 and FIG. 4, the region, in which the horizontal unit and the perpendicular unit of the divided-voltage reference voltage line 172 are disposed, corresponds to a region in which the minute branches are not disposed in the pixel electrode 191.

The first sub-pixel area will now be described in detail with reference to FIG. 3 and FIG. 4.

A first horizontal unit of the divided-voltage reference voltage line, which defines the uppermost part of the divided-voltage reference voltage line 172 and extends to the left side from the right side, is disposed on an edge of the minute branch.

A second perpendicular unit 174 of the divided-voltage reference voltage line, which is connected to a first side end (e.g., a left side end) of the first horizontal unit and is disposed on the left side, overlaps the second perpendicular stem of the first sub-pixel electrode 191a.

A second horizontal unit of the divided-voltage reference voltage line, the first side end of which is connected to the second perpendicular unit 174 and extends to a second side end (e.g., the right side), is disposed between the minute branch extending from the first horizontal stem of the first sub-pixel electrode and the minute branch extending from the second horizontal stem.

A second perpendicular unit of the divided-voltage reference voltage line, which is connected to the second side end of the second horizontal unit of the divided-voltage reference voltage line and is disposed on the second side (left side) of a single pixel area, extends to the second sub-pixel area. In such an embodiment, a third horizontal unit 177 may extend in the center of the second perpendicular unit in the horizontal direction.

The third horizontal unit 177 of the divided-voltage reference voltage line is disposed below the minute branch extending from the first horizontal stem 193a of the first sub-pixel electrode.

The second sub-pixel area may correspond to the first sub-pixel area.

The first sub-pixel electrode 191a and the second sub-pixel electrode 191b are physically and electrically connected to the first drain electrode 175a and the second drain electrode 175b through the first contact hole 185a and the second contact hole 185b, and receive a data voltage from the first drain electrode 175a and the second drain electrode 175b. In such an embodiment, a part of the data voltage applied to the second drain electrode 175b is divided by the third source electrode 173c and the voltage applied to the first sub-pixel electrode 191a becomes greater than the voltage applied to the second sub-pixel electrode 191b.

Figure 5:
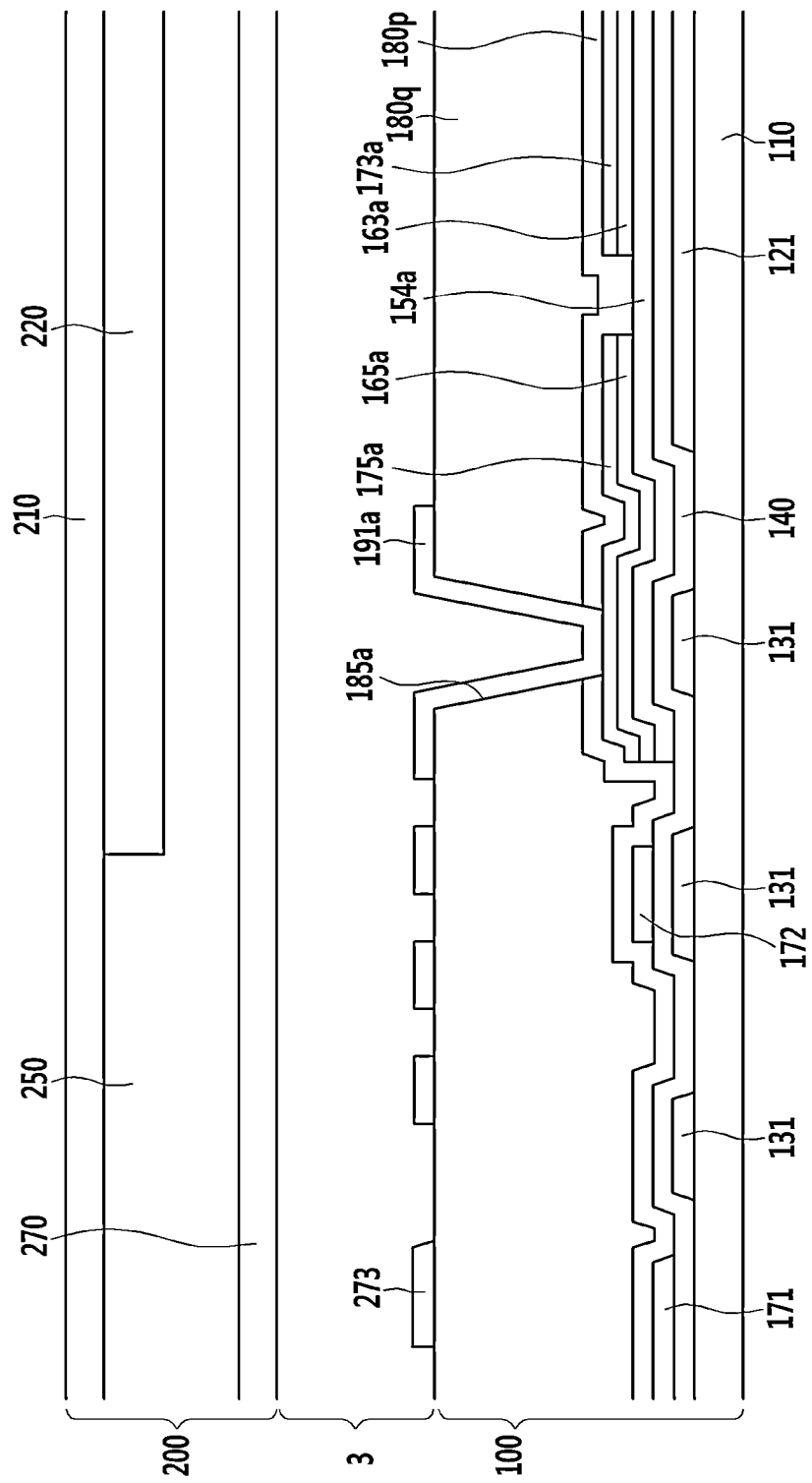
FIG. 5 is a cross-sectional view of an exemplary embodiment of a liquid crystal display according to an the invention.

A liquid crystal display including a thin film transistor display panel will now be described with reference to FIG. 5. FIG. 5 is a cross-sectional view of an exemplary embodiment of a liquid crystal display according to the invention.

Referring to FIG. 5, a lower panel 100 of such an embodiment of a liquid crystal display is substantially the same as the lower panel of the exemplary embodiments of the thin film transistor display panel described above with reference to FIG. 2, and any repetitive detailed description thereof will be omitted.

Hereinafter, an upper panel 200 of an exemplary embodiment of a liquid crystal display will now be described.

In such an embodiment, the upper panel 200 includes an insulation substrate 210 including a transparent material, such as glass and plastic, for example. In such an embodiment, a light blocking member 220 is disposed on the insulation substrate 210. The light blocking member 220 may be referred to as a black matrix that prevents light leakage.

A plurality of color filters (not shown) may be disposed on the insulation substrate 210. In an exemplary embodiment, the second passivation layer 180q of the lower panel 100 may function as a color filter, and the color filter of upper panel 200 may be omitted. In an exemplary embodiment, the light blocking member 220 of the upper panel 200 may be disposed on the lower panel 100.

In an exemplary embodiment, as shown in FIG. 5, an overcoat 250 is disposed on the color filter and the light blocking member 220. The overcoat 250 may include or be made of an (organic) insulating material, effectively prevents exposure of the color filter and provides a flat side. In an alternative exemplary embodiment, the overcoat 250 may be omitted.

A liquid crystal layer 3 may be disposed between the lower panel 100 and the upper panel 200. The liquid crystal layer 3 may have negative dielectric anisotropy, and longitudinal axes of liquid crystal molecules of the liquid crystal layer 3 may be aligned substantially perpendicular to a surface of the display panels 100 and 200 when electric field is not generated therein.

The first sub-pixel electrode 191a and the second sub-pixel electrode 191b, to which the data voltage is applied, generate an electric field together with a common electrode 270 of the upper panel 200 to determine a direction of the liquid crystal molecules of the liquid crystal layer 3 between the two electrodes 191 and 270. Luminance of the light passing through the liquid crystal layer 3 is changed or controlled by the above-determined direction of the liquid crystal molecules.

Figure 6:
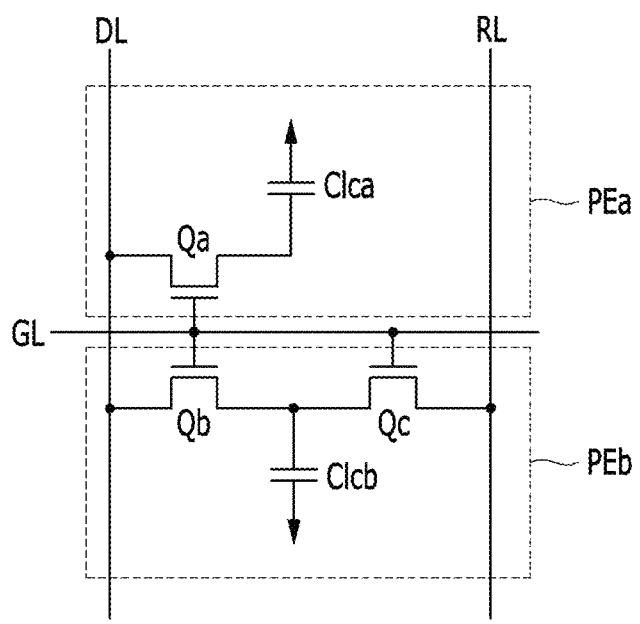
FIG. 6 is an equivalent circuit diagram showing a pixel of an exemplary embodiment of a liquid crystal display according to the invention.

A signal line and pixels of an exemplary embodiment of a liquid crystal display and an exemplary embodiment of a driving method thereof, according to the invention, will now be described with reference to FIG. 6. FIG. 6 is an equivalent circuit diagram showing a pixel of an exemplary embodiment of a liquid crystal display according to the invention.

Referring to FIG. 6, each pixel of an exemplary embodiment of the liquid crystal includes a plurality of signal lines including a gate line (GL) for transmitting a gate signal, a data line (DL) for transmitting a data signal, and a divided-voltage reference voltage line (RL) for transmitting a divided-voltage reference voltage, and first, second and third switching elements (Qa, Qb and Qc) connected to a plurality of signal lines, and first and second liquid crystal capacitors (Clca and Clcb).

The first and second switching elements (Qa and Qb) are connected to the gate line (GL) and the data line (DL), and the third switching element (Qc) is connected to an output terminal of the second switching element (Qb) and the divided-voltage reference voltage line (RL).

The first switching element (Qa) and the second switching element (Qb) may be three-terminal elements, e.g., a thin film transistor, a control terminal of the first switching element (Qa) is connected to the gate line (GL), an input terminal of the first switching element (Qa) is connected to the data line (DL), an output terminal of the first switching element (Qa) is connected to the first liquid crystal capacitor (Clca), and an output terminal of the second switching element (Qb) is connected to the second liquid crystal capacitor (Clcb) and an input terminal of the third switching element (Qc).

The third switching element (Qc) is a three-terminal element, e.g., the thin film transistor, a control terminal of the third switching element (Qc) is connected to the gate line (GL), an input terminal of the third switching element (Qc) is connected to the second liquid crystal capacitor (Clcb), and an output terminal of the third switching element (Qc) is connected to the divided-voltage reference voltage line (RL).

In such an embodiment, when a gate-on signal is applied to the gate line (GL), the first switching element (Qa), the second switching element (Qb) and the third switching element (Qc), which are connected to the gate line (GL), are turned on. The data voltage applied to the data line (DL) is applied to the first sub-pixel electrode (PEa) and the second sub-pixel electrode (PEb) through the turned-on first and second switching elements (Qa and Qb). In such an embodiment, the data voltages applied to the first sub-pixel electrode (PEa) and the second sub-pixel electrode (PEb) are substantially the same as each other, and the first liquid crystal capacitor (Clca) and the second liquid crystal capacitor (Clcb) are charged with substantially a same value corresponding to a difference between the common voltage and the data voltage. Simultaneously, the voltage charged in the second liquid crystal capacitor (Clcb) is divided by the turned-on third switching element (Qc). Therefore, the voltage value stored in the second liquid crystal capacitor (Clcb) is lower by a difference between the common voltage and the divided-voltage reference voltage, such that the voltage charged in the first liquid crystal capacitor (Clca) becomes greater than the voltage charged in the second liquid crystal capacitor (Clcb).

As described above, in such an embodiment, the voltage charged in the first liquid crystal capacitor (Clca) becomes different from the voltage charged in the second liquid crystal capacitor (Clcb). The voltage of the first liquid crystal capacitor (Clca) is different from the voltage of the second liquid crystal capacitor (Clcb) such that angles of the liquid crystal molecules in the first sub-pixel and the second sub-pixel are different from each other, and luminances of the two kinds of sub-pixels thereby become different from each other. Therefore, when the voltage of the first liquid crystal capacitor (Clca) and the voltage of the second liquid crystal capacitor (Clcb) are effectively controlled to allow the image viewed from the lateral side to be substantially close, e.g., as close as possible, to the image viewed from the front side, and thus lateral visibility may be improved.

In an exemplary embodiment, as described above, the third switching element (Qc) is connected between the second liquid crystal capacitor (Clcb) and the divided-voltage reference voltage line (RL) to allow the voltage charged in the first liquid crystal capacitor (Clca) to be different from the voltage charged in the second liquid crystal capacitor (Clcb). In an alternative exemplary embodiment of a liquid crystal display may include a step-down capacitor, to which the second liquid crystal capacitor (Clcb) is connected. In such an embodiment, the liquid crystal display may include a third switching element including a first terminal connected to a step-down gate line, a second terminal connected to the second liquid crystal capacitor (Clcb), and a third terminal connected to the step-down capacitor such that a portion of an amount of charges stored in the second liquid crystal capacitor (Clcb) may be charged to the step-down capacitor, and a charging voltage between the first liquid crystal capacitor (Clcb) and the second liquid crystal capacitor (Clcb) may be set in a different manner. In another alternative exemplary embodiment of the liquid crystal display according to the invention, the first liquid crystal capacitor (Clcb) and the second liquid crystal capacitor (Clcb) may be connected to different data lines and receive different data voltages, such that a different charged voltage between the first liquid crystal capacitor (Clcb) and the second liquid crystal capacitor (Clcb) may be set. In an exemplary embodiment, the charged voltage between the first liquid crystal capacitor (Clcb) and the second liquid crystal capacitor (Clcb) may be set to have different values using other various methods.

Figure 7:
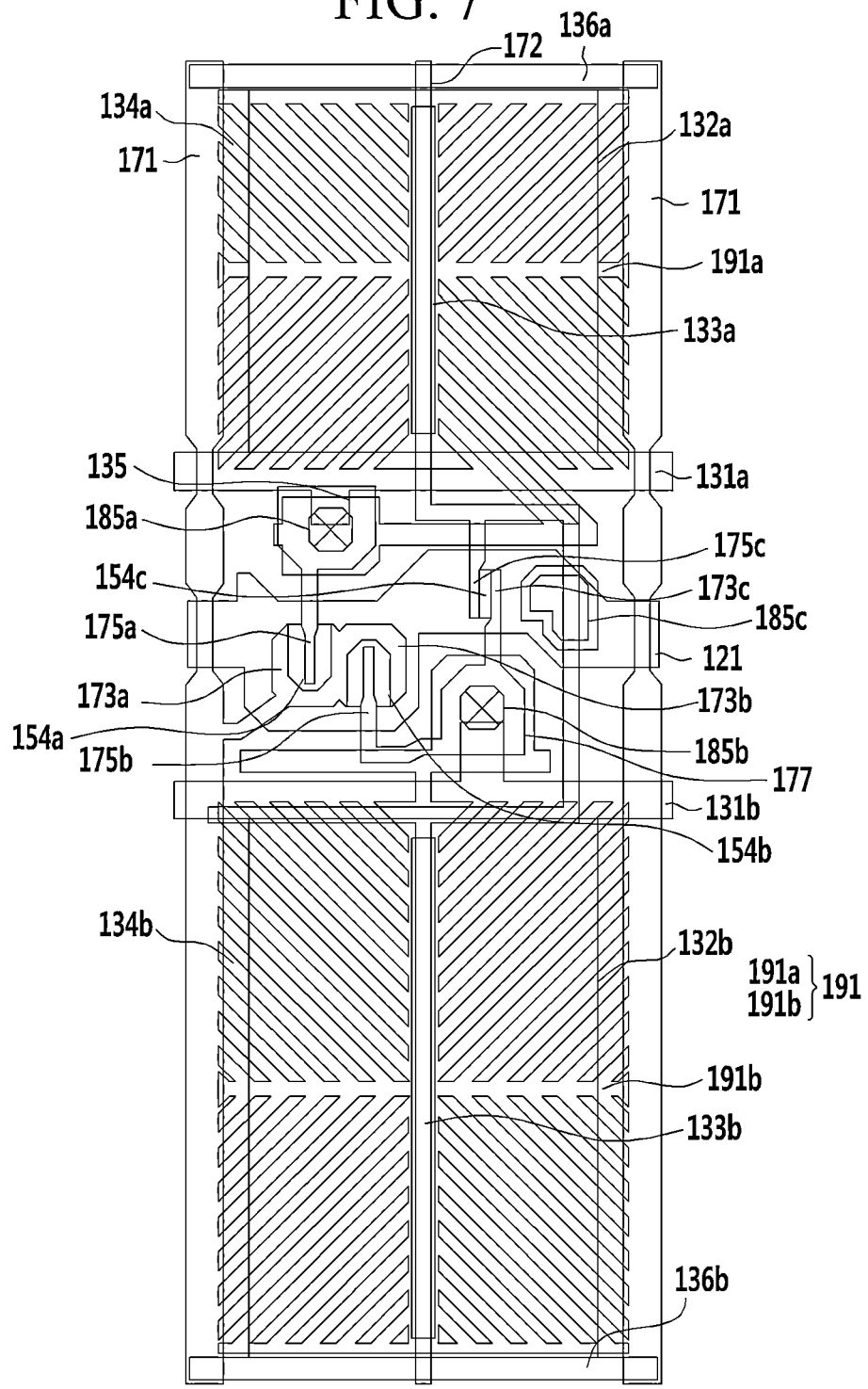
FIG. 7 is a plan view of a comparative embodiment of a thin film transistor display panel.
Figure 8:
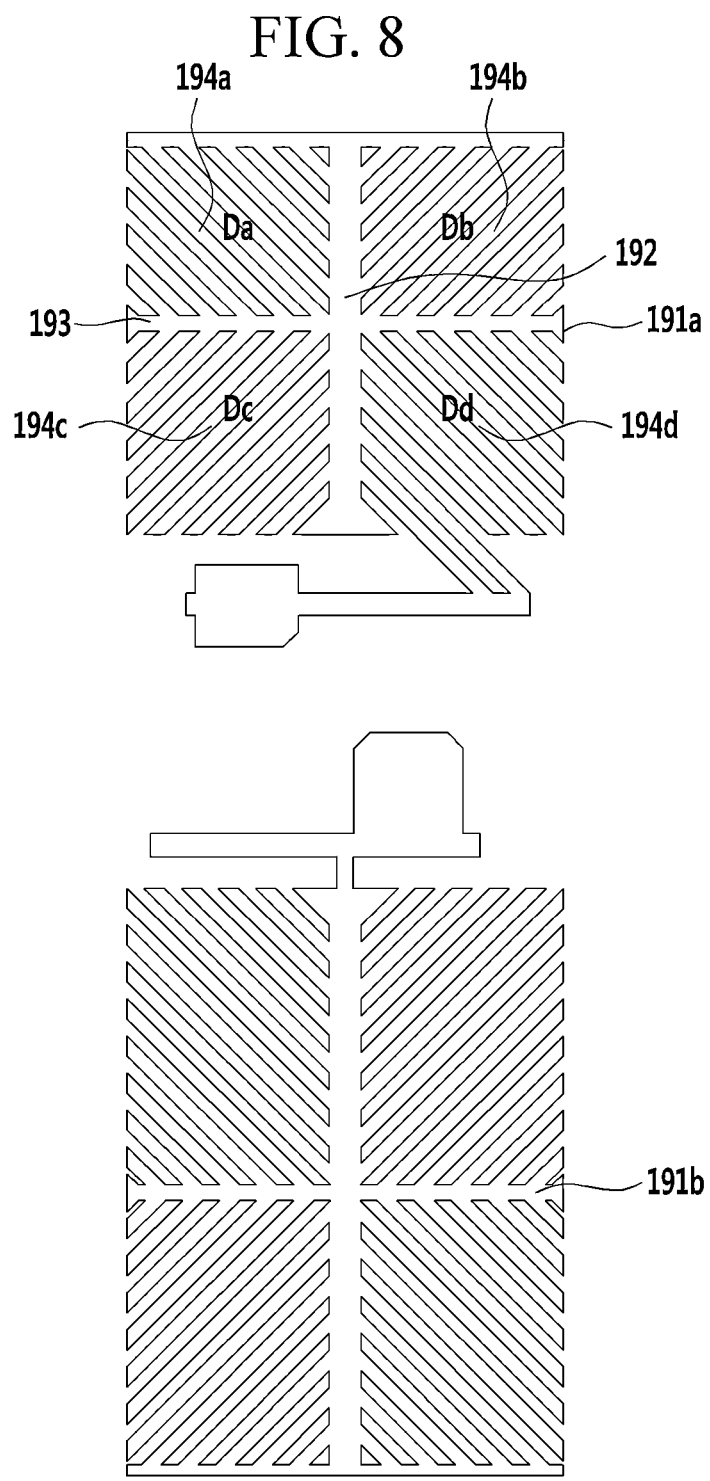
FIG. 8 is a plan view of a pixel electrode of the comparative embodiment of a liquid crystal display.
Figure 9:
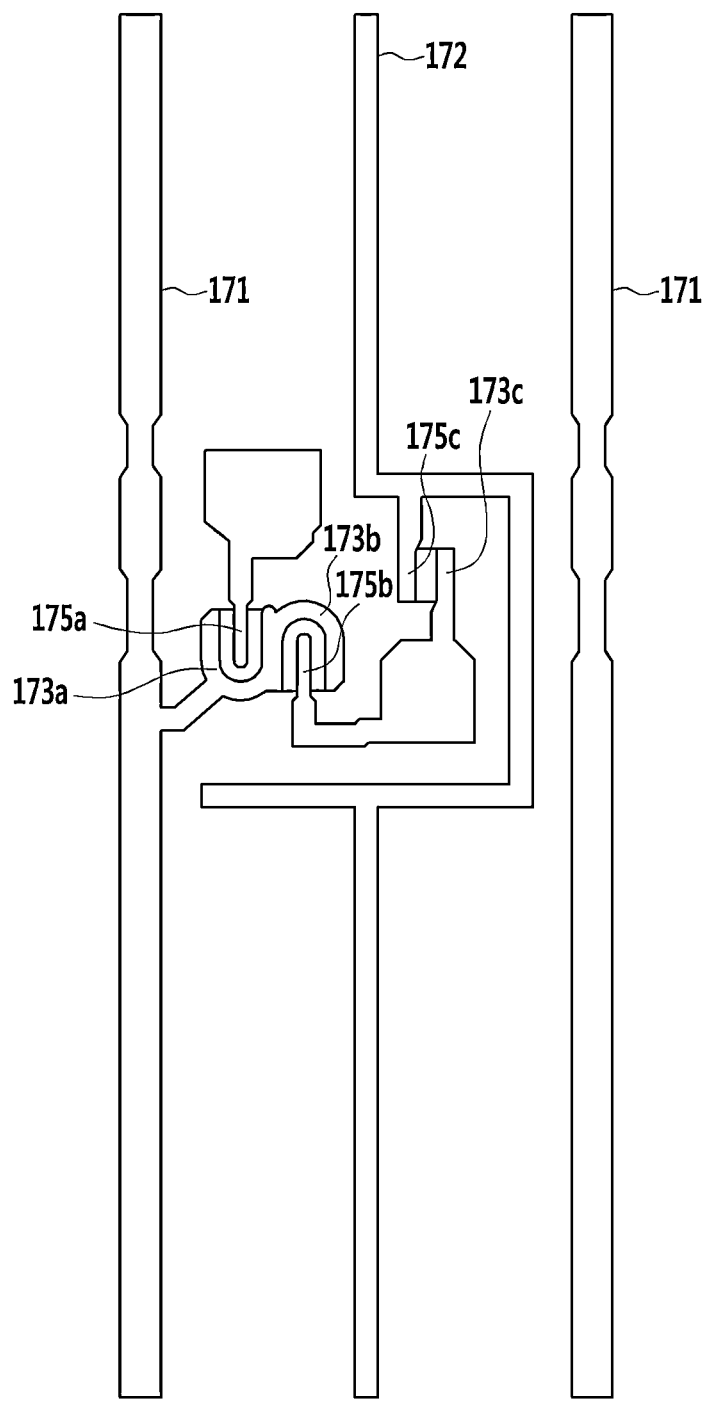
FIG. 9 is a plan view of a data line and a divided-voltage reference voltage line of the comparative embodiment of a liquid crystal display.

Referring to FIG. 7 to FIG. 9, a comparative embodiment of a liquid crystal display will now be described.

FIG. 7 is a plan view of a comparative embodiment of a thin film transistor display panel. FIG. 8 shows a pixel electrode of a comparative embodiment of a liquid crystal display. FIG. 9 shows a data line and a divided-voltage reference voltage line of a comparative embodiment of a liquid crystal display.

Referring to FIG. 9, a divided-voltage reference voltage line 172 of a comparative embodiment of a liquid crystal display may extend vertically along a center of a pixel area in a perpendicular manner. A part of the divided-voltage reference voltage line 172 disposed outside the pixel area may define a third drain electrode 175c.

Referring to FIG. 8, the pixel electrode of a comparative embodiment of the liquid crystal display has a quadrangular shape, and includes a cross stem including a horizontal stem 193 and a perpendicular stem 192 that crosses the horizontal stem 193. In such a comparative embodiment, as shown in FIG. 8, a unit pixel electrode in each sub-pixel are is divided into a first sub-region (Da), a second sub-region (Db), a third sub-region (Dc) and a fourth sub-region (Dd) by the horizontal stem 193 and the perpendicular stem 192, and the sub-regions (Da-Dd) include a plurality of first minute branches 194a, a plurality of second minute branches 194b, a plurality of third minute branches 194c, and a plurality of fourth minute branches 194d, respectively.

The first minute branch 194a obliquely extends in the left upward direction from the horizontal stem 193 or the perpendicular stem 192, and the second minute branch 194b obliquely extends in the right upward direction from the horizontal stem 193 or the perpendicular stem 192. The third minute branch 194c extends in the left downward direction from the horizontal stem 193 or the perpendicular stem 192, and the fourth minute branch 194d extends in the right downward direction from the horizontal stem 193 or the perpendicular stem 192.

Referring to FIG. 7 to FIG. 9, the perpendicular stem 192 of the pixel electrode corresponds to the divided-voltage reference voltage line 172. That is, the perpendicular stem 192 and the divided-voltage reference voltage line 172 of the pixel electrode are disposed at a same position to overlap each other when viewed from a plan view, and the perpendicular stem 192 and the divided-voltage reference voltage line 172 of the pixel electrode are insulated by a passivation layer.

In such a comparative embodiment, the divided-voltage reference voltage line 172 and the perpendicular stem 192 of the pixel electrode are perpendicularly provided in a pixel area.

In an exemplary embodiment of the liquid crystal display according to the invention, the divided-voltage reference voltage line 172 and the stem of the pixel electrode include the horizontal unit and the perpendicular unit, as described above. In such an embodiment of the invention, the horizontal stem of the pixel electrode is disposed in the horizontal direction, and the perpendicular stem of the pixel electrode is disposed at an edge rather than in the center of the pixel area.

Accordingly, in an exemplary embodiment of the liquid crystal display having the divided-voltage reference voltage line and the pixel electrode, generation of texture caused by misalignment of the upper and lower panels is substantially reduced or effectively prevented when the liquid crystal display is bent, compared to such a comparative embodiment of the liquid crystal display.

A reduction effect of texture in an exemplary embodiment of the liquid crystal display will now be described in greater detail.

The comparative embodiment of the liquid crystal display described above provides the divided-voltage reference voltage line and the stem of the pixel electrode in the perpendicular direction. In such a comparative embodiment, the divided-voltage reference voltage line overlaps the stem of the pixel electrode with a passivation layer therebetween in the perpendicular direction. However, when the liquid crystal display is bent to the right or left direction, a misalignment between the divided-voltage reference voltage line and the stem of the pixel electrode may occur, such that the divided-voltage reference voltage line does not overlap the stem of the pixel electrode in the perpendicular direction, which is visible as a texture.

In an exemplary embodiment of the liquid crystal display according to the invention, the divided-voltage reference voltage line and the stem of the pixel electrode may extend in the horizontal direction and the perpendicular direction. However, in such an embodiment, the horizontal stem of the pixel electrode crosses over the center of the pixel area, and a minute branch is extending from the horizontal stem to form a domain, and the perpendicular stem of the pixel electrode may be disposed at a side of the pixel area. Therefore, in such an embodiment of the invention, the stem is disposed substantially in the horizontal direction in a pixel area of the liquid crystal display.

Accordingly, when the liquid crystal display is a curbed display or the liquid crystal display is bent horizontally to the right side and left side, the texture caused by misalignment may be effectively prevented.

The divided-voltage reference voltage line overlaps the perpendicular stem of the pixel electrode or a gap between neighboring minute branches, that is, the divided-voltage reference voltage line may overlap a non-transmission region of the pixel electrode. Therefore, no additional reduction of transmittance caused by the divided-voltage reference voltage line occurs, such that the divided-voltage reference voltage line may maximize transmittance in the liquid crystal display.

When the pixel electrode includes the horizontal stem and the minute branch extending from the horizontal stem as shown in FIG. 4, and the divided-voltage reference voltage line extends in the perpendicular direction as shown in FIG. 9, the divided-voltage reference voltage line is not hidden by the stem of the pixel electrode when viewed from a plan view. Therefore, transmittance may be reduced by the exposed portion of divided-voltage reference voltage line through the pixel electrode.

However, in an exemplary embodiment, the divided-voltage reference voltage line passes through the non-transmission region of the pixel electrode, such that additional transmittance blockage caused by the divided-voltage reference voltage line may not occur.

In an exemplary embodiment, an overlapping region where the perpendicular stem of the divided-voltage reference voltage line overlaps the perpendicular stem of the pixel electrode is not in the center of the pixel area, but is an edge of the pixel area. Therefore, in such an embodiment, when the liquid crystal panel is bent horizontally to the right side and the left side to be configured as a curved display, the overlapping region is not viewed as a texture when the perpendicular stem of the divided-voltage reference voltage line and the perpendicular stem of the pixel electrode are misaligned.

Figure 10:
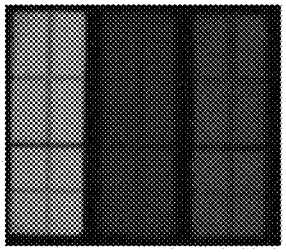
FIG. 10 shows a pixel image in a flat state and a curved state of a pixel configuration according to a comparative embodiment of a liquid crystal display (normal type) and an exemplary embodiment of a liquid crystal display according to the invention (horizontal type)

FIG. 10 shows a pixel image in a flat state and a curved state of a pixel configuration according to a comparative embodiment (normal type) and an exemplary embodiment of the invention (horizontal type). As shown in FIG. 10, a texture is invisible in the flat plate state in the comparative embodiment and the exemplary embodiment of the invention. In the comparative embodiment shown in FIG. 10, the dark cross region corresponds to the stem of the pixel electrode. As shown in FIG. 10, the comparative embodiment of the liquid crystal display has the stem of the pixel electrode as a cross shape.

In the exemplary embodiment of the invention shown in FIG. 10, the horizontal region shows a dark line, which corresponds to the horizontal stem of the pixel electrode. Therefore, as shown in FIG. 10, the exemplary embodiment of the liquid crystal display according to the invention has the stem of the pixel electrode as a horizontal type.

Referring to FIG. 10, in the curved state, texture is more visible in the comparative embodiment of the liquid crystal display. That is, a width of the perpendicular stem is shown to be greater by misalignment of the upper and lower panels. The perpendicular stem of the divided-voltage reference voltage line overlaps the perpendicular stem of the pixel electrode in the flat panel state, and when the panel is bent in the horizontal direction, the perpendicular stem of the divided-voltage reference voltage line and the perpendicular stem of the pixel electrode do not overlap each other, and the perpendicular stem of the divided-voltage reference voltage line and the perpendicular stem of the pixel electrode are visible as non-transmission regions.

However, in an exemplary embodiment of the liquid crystal display according to the invention, the perpendicular unit of the divided-voltage reference voltage line and the perpendicular unit of the pixel electrode are provided on the edge of the pixel area, and the horizontal unit is provided in the center of the pixel area. Therefore, when the panel is bent in the horizontal region to be configured as a curved panel, additional texture does not occur in the center of the actually visible pixel area. The stem provided in the horizontal direction is not misaligned when the panel is bent in the horizontal direction.

Accordingly, an exemplary embodiment of the liquid crystal display including a pixel electrode structure and a divided-voltage reference voltage line structure described above may be effectively adapted into a curved display. In such an embodiment, the stems of the pixel electrode and the divided-voltage reference voltage line extend in the horizontal direction, such that no misalignment occurs by bending the display panel in the horizontal direction. Therefore, in such an embodiment, when the panel is bent in the horizontal direction, a texture may be effectively prevented from being generated by such a misalignment.

Referring to FIG. 11 to FIG. 17, an exemplary embodiment of a method for manufacturing a thin film transistor display panel, according to the invention, will now be described. FIG. 11 to FIG. 17 are views showing an exemplary embodiment of a process for manufacturing a thin film transistor display panel, according to the invention. The same or like elements shown in FIGS. 11 to 17 have been labeled with the same reference characters as used above to describe the exemplary embodiments of the thin film transistor display panel shown in FIGS. 1 to 5, and any repetitive detailed description thereof will hereinafter be omitted or simplified.

Figure 11:
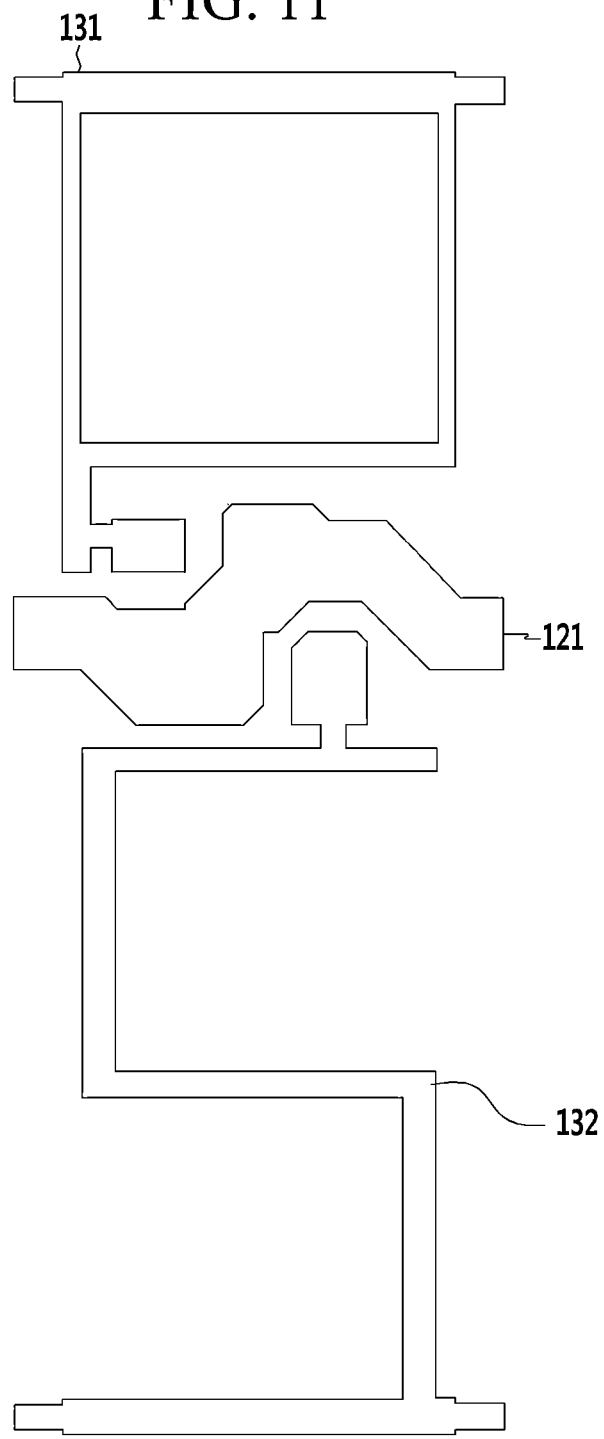
FIG. 11 to FIG. 17 are views showing an exemplary embodiment of a method of manufacturing a thin film transistor display panel according to the invention.

As shown in FIG. 11, a gate conductor including a gate line 121 and storage electrode lines 131 and 132 is provided, e.g., formed, on an insulation substrate 110 including a transparent material such as glass or plastic, for example.

The gate line 121 crosses each pixel area. The storage electrode lines 131 and 132 may be made of the same material as the gate line 121, and may be formed together with the gate line 121 by a same or concurrent process.

The storage electrode line 131 at an upper region of the gate line 121 may have a shape that surrounds the first sub-pixel area in a quadrangular manner. A side at the uppermost portion on the quadrangular storage electrode line 131 may further extend from a pixel area in the horizontal direction, and may be connected to another layer or an external driving circuit.

The storage electrode line 132 at the lower region of the gate line 121 may be provided in a shape that is similar to the shape of the number 5 in the second sub-pixel area. In an exemplary embodiment, the storage electrode line 132 includes a plurality of horizontal units and a plurality of perpendicular units for connecting the horizontal units, and the perpendicular units connect same side ends of the horizontal units that are disposed substantially parallel to each other. In an exemplary embodiment, when left ends of the first horizontal unit and the second horizontal unit are by the perpendicular unit, right ends of the second horizontal unit and the third horizontal unit are connected by the perpendicular unit.

Figure 12:
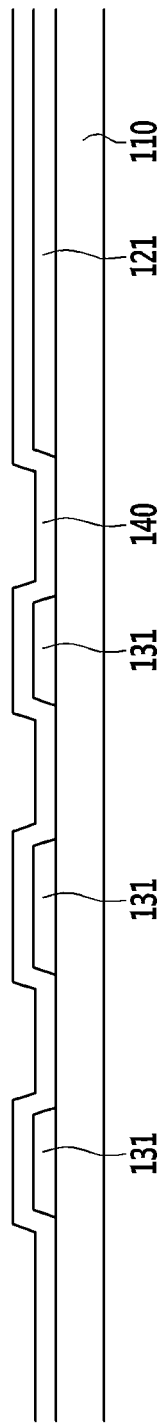

As shown in FIG. 12, a gate insulating layer 140 is provided on the conductor including the gate line 121 and the storage electrode lines 131 and 132.

Figure 13:
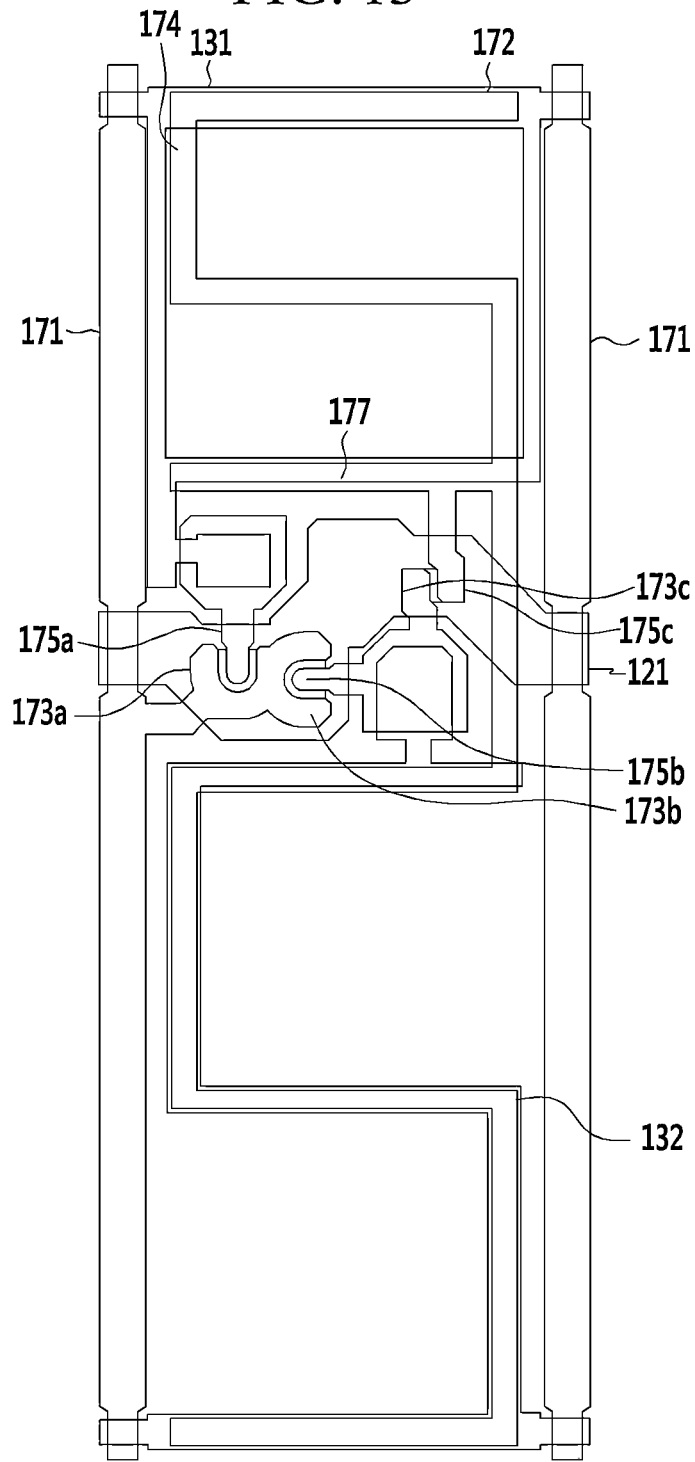
Figure 14:
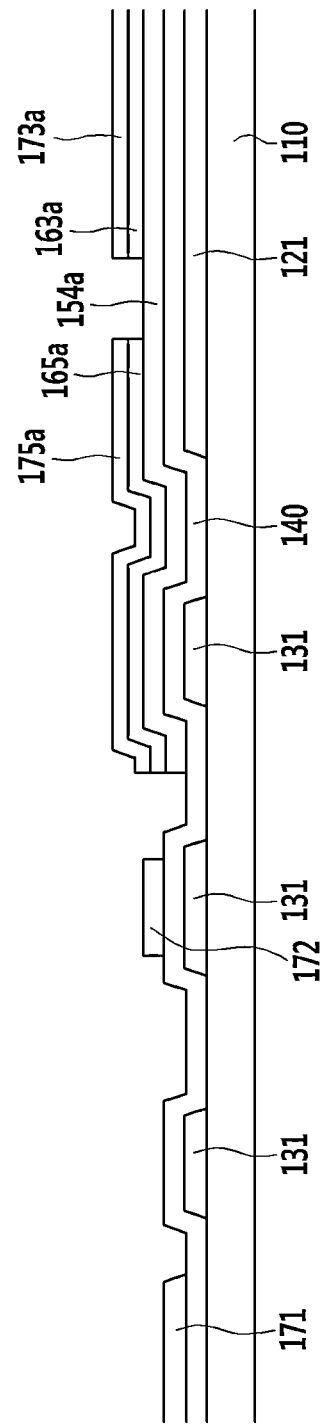

A data conductor is provided on the gate insulating layer 140 as shown in FIG. 13 and FIG. 14. A semiconductor and an ohmic contact may be provided below the data conductor, and the semiconductor and the ohmic contact may be simultaneously formed using a same mask.

The data conductor includes a data line 171, a first drain electrode 175a, a second drain electrode 175b and a divided-voltage reference voltage line 172.

The data line 171 proceeds in the perpendicular direction along a pixel area, and forms a first source electrode 173a and a second source electrode 173b.

In such an embodiment, the data conductor includes a divided-voltage reference voltage line 172 that extends in a direction that is parallel to the data line 171, and the divided-voltage reference voltage line 172 forms a third drain electrode 175c.

The divided-voltage reference voltage line 172 includes a plurality of horizontal units and a plurality of perpendicular units for connecting the horizontal units, and the divided-voltage reference voltage line 172 may have a shape similar to the shape of the number 5. That is, the divided-voltage reference voltage line 172 includes a plurality of horizontal units and a plurality of perpendicular units for connecting side ends of the horizontal units that are disposed substantially parallel to each other. In such an embodiment, left ends of the first horizontal unit and the second horizontal unit are connected by a perpendicular unit, and right sides of the second horizontal unit and the third horizontal unit are connected by a perpendicular unit.

Figure 15:
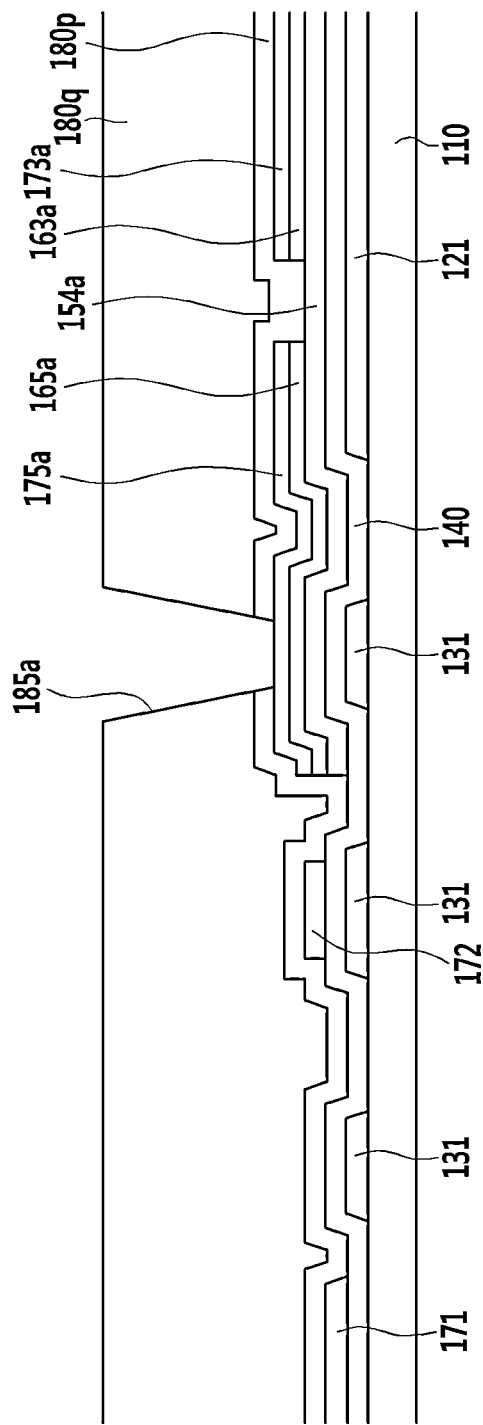

Referring to FIG. 15, a first passivation layer 180p and a second passivation layer 180q are sequentially provided, e.g., stacked, on the data conductor and the semiconductor, and contact holes 185a and 185b for partially exposing the first drain electrode 175a and the second drain electrode 175b are formed through the first and second passivation layers 180p and 180q.

Figure 16:
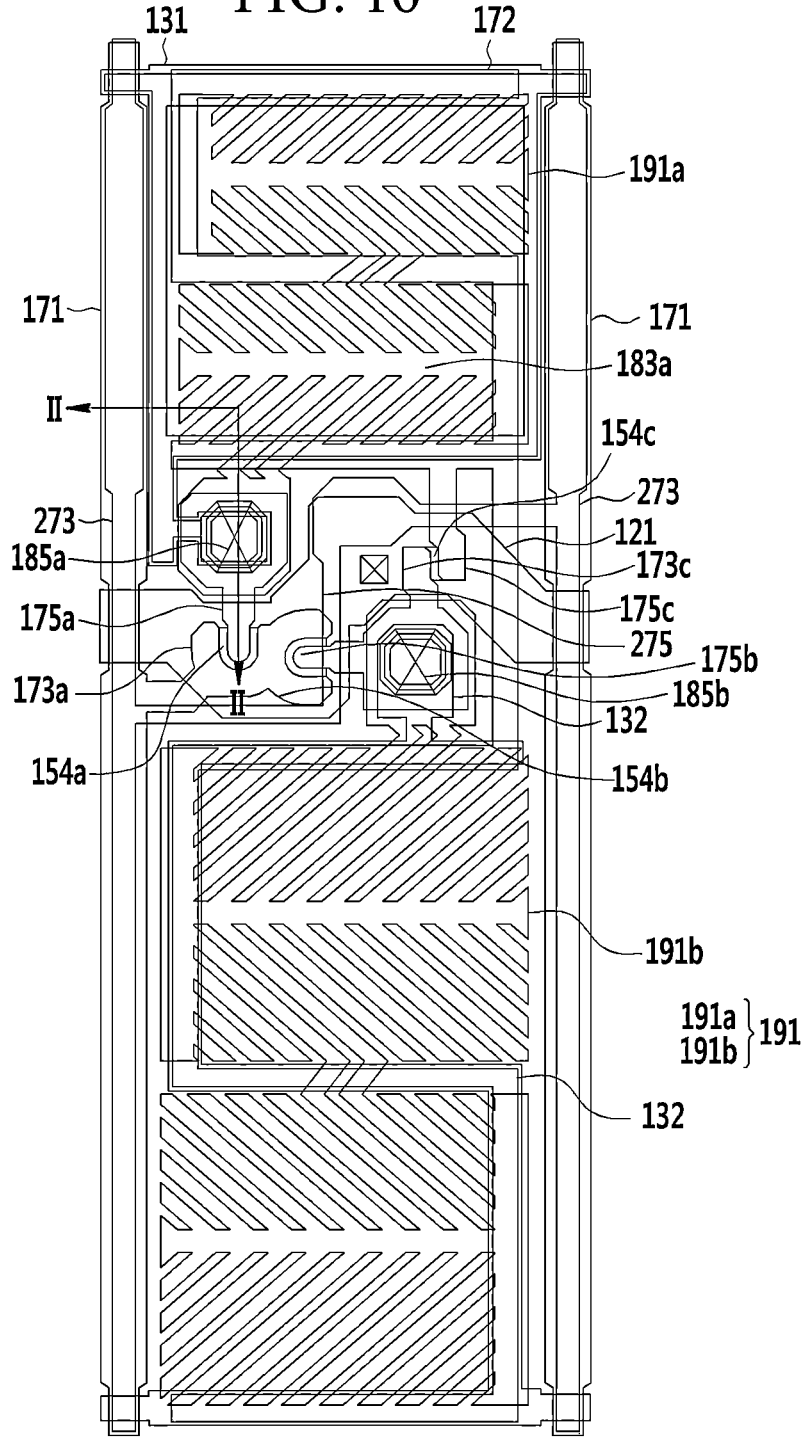
Figure 17:
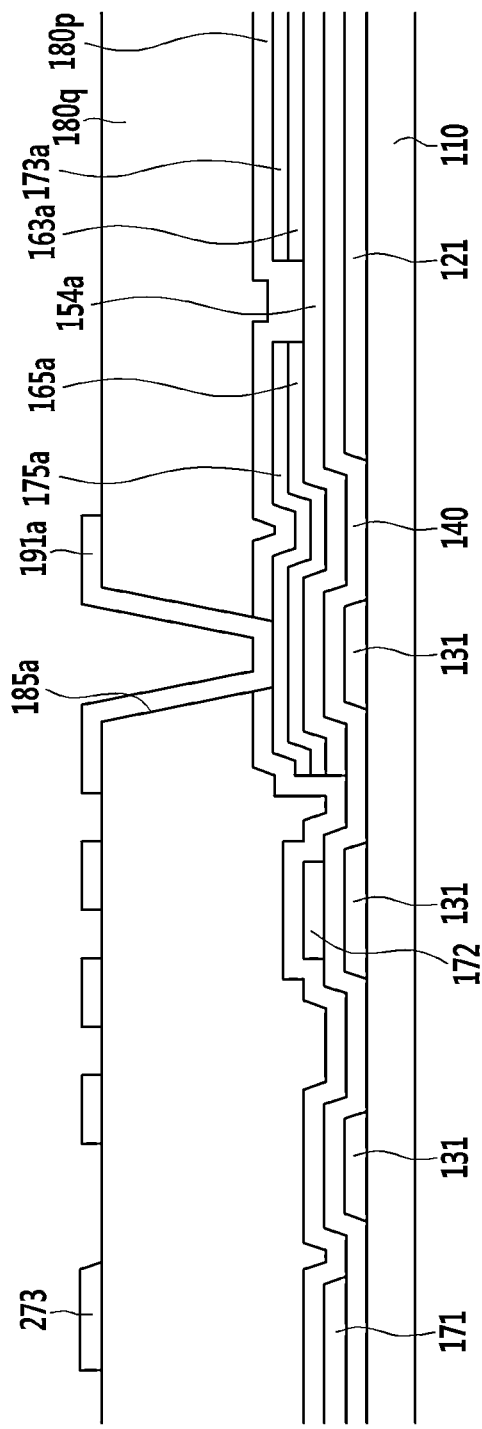

Referring to FIG. 16 and FIG. 17, a pixel electrode 191 is provided on the second passivation layer 180q. The pixel electrode 191 is connected to the drain electrode through contact holes 185a and 185b and receives a current. The shape of the pixel electrode is substantially the same as the shape of the pixel electrode in the exemplary embodiments described above. In such an embodiment, the pixel electrode 191 includes a first sub-pixel electrode 191a and a second sub-pixel electrode 191b neighboring in the column direction with respect to the gate line 121.

The respective sub-pixel electrodes 191a and 191b include two horizontal stems extending in the horizontal direction and a plurality of minute branches extending in the diagonal direction from respective sides of the horizontal stems. Each horizontal stem is connected to the perpendicular stem at an end thereof, and neighboring perpendicular stems are provided at opposing sides in the sub-pixel area.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor display panel comprising:
   a first substrate;
   a gate line disposed on the first substrate;
   a storage electrode line disposed on the first substrate;
   a gate insulating layer disposed on the gate line;
   a plurality of thin film transistors disposed on the gate insulating layer;
   a divided-voltage reference voltage line disposed on the gate insulating layer;
   a passivation layer which covers the thin film transistors and divide-voltage reference voltage line, wherein a first contact hole and a second contact hole are defined through the passivation layer;
   a first sub-pixel electrode electrically connected to a first thin film transistor of the thin film transistors through the first contact hole, and comprising a plurality of pixel branch electrodes; and
   a second sub-pixel electrode electrically connected to a second thin film transistor of the thin film transistors through the second contact hole, and comprising a plurality of pixel branch electrodes,
   wherein the first sub-pixel electrode comprises a first sub horizontal stem and a first sub perpendicular stem connected to an end of the first sub horizontal stem,
   the second sub-pixel electrode comprises a second sub horizontal stem and a second sub perpendicular stem connected to an end of the second sub horizontal stem,
   the divided-voltage reference voltage line comprises a horizontal unit and a perpendicular unit, and
   the perpendicular unit of the divided-voltage reference voltage line overlaps the first sub perpendicular stem of the first sub-pixel electrode and the second sub perpendicular stem of the second sub-pixel electrode.

2. The thin film transistor display panel of claim 1, wherein
   the first sub horizontal stem comprising a first horizontal stem and a second horizontal stem, the first horizontal stem and the second horizontal stem extending substantially in a horizontal direction,
   a plurality of minute branches extending in an oblique direction from the first and second horizontal stems,
   the second sub horizontal stem comprising a first horizontal stem and a second horizontal stem, the first horizontal stem and the second horizontal stem extending substantially in horizontal direction, and
   a plurality of minute branches extending in an oblique direction from the first and second horizontal stems.

3. The thin film transistor display panel of claim 2, wherein
   the divided-voltage reference voltage line divides a first sub-pixel area in which the first sub-pixel electrode is provided into two regions and surrounds three sides in an individual region, and
   the divided-voltage reference voltage line divides a second sub-pixel area in which the second sub-pixel electrode is provided into two regions and surrounds three sides in an individual region.

4. The thin film transistor display panel of claim 3, wherein
   a minute branch extending from the first horizontal stem of the first sub-pixel electrode is connected to a minute branch extending from the second horizontal stem of the first sub-pixel electrode, and
   a minute branch extending toward the gate line from the second horizontal stem of the first sub-pixel electrode is connected to an expansion of the first sub-pixel electrode and receives a voltage from the first thin film transistor through the first contact hole.

5. The thin film transistor display panel of claim 4, wherein
   a minute branch extending from the first horizontal stem of the second sub-pixel electrode is connected to a part of a minute branch extending from the second horizontal stem of the second sub-pixel electrode, and
   a minute branch extending toward the gate line from the first horizontal stem of the second sub-pixel electrode is connected to an expansion of the second sub-pixel electrode and receives the voltage from the second thin film transistor through the second contact hole.

6. The thin film transistor display panel of claim 5, wherein
   the first sub perpendicular stem comprising a first perpendicular stem and a second perpendicular stem,
   the first perpendicular stem substantially perpendicular to the first horizontal stem of the first sub-pixel electrode and connected to an end of the first horizontal stem of the first sub-pixel electrode; and
   the second perpendicular stem substantially perpendicular to the second horizontal stem of the first sub-pixel electrode and connected to an end of the second horizontal stem of the first sub-pixel electrode, and
   wherein position of the first perpendicular stem in the first sub-pixel area is opposite to a position of the second perpendicular stem in the first sub-pixel area.

7. The thin film transistor display panel of claim 6, wherein
   the second sub perpendicular stem comprising a first perpendicular stem and a second perpendicular stem,
   the first perpendicular stem substantially perpendicular to the first horizontal stem of the second sub-pixel electrode and connected to an end of the first horizontal stem of the second sub-pixel electrode, and the second perpendicular stem substantially perpendicular to the second horizontal stem of the second sub-pixel electrode and connected to an end of the second horizontal stem of the second sub-pixel electrode, wherein a position of the first perpendicular stem in the second sub-pixel area is opposite to a position of the second perpendicular stem in the second sub-pixel area.

8. The thin film transistor display panel of claim 7, wherein the first perpendicular stem and the second perpendicular stem of the first sub-pixel electrode overlap the perpendicular unit of the divided-voltage reference voltage line, and the horizontal unit of the divided-voltage reference voltage line is disposed between a minute branch extending from the first horizontal stem of the first sub-pixel electrode and a minute branch extending from the second horizontal stem of the first sub-pixel electrode.

9. The thin film transistor display panel of claim 8, wherein the first perpendicular stem and the second perpendicular stem of the second sub-pixel electrode overlap the perpendicular unit of the divided-voltage reference voltage line, and the horizontal unit of the divided-voltage reference voltage line is disposed between a minute branch extending from the first horizontal stem of the second sub-pixel electrode and a minute branch extending from the second horizontal stem of the second sub-pixel electrode.

10. The thin film transistor display panel of claim 9, wherein a portion of the divided-voltage reference voltage line in the first sub-pixel area comprises:

a first horizontal unit, a second horizontal unit and a third horizontal unit, which extend substantially in the horizontal direction in the first sub-pixel area, a first perpendicular unit connected to an end of the first horizontal unit and an end of the second horizontal unit at a first side, and a second perpendicular unit connected to an end of the second horizontal unit and an end of the third horizontal unit at a second side, and a portion of the divided-voltage reference voltage line in the second sub-pixel area comprises:

a first horizontal unit, a second horizontal unit and a third horizontal unit which extend substantially in the horizontal direction in the second sub-pixel area, a first perpendicular unit connected an end of the first horizontal unit and an end of the second horizontal unit at the first side, and a second perpendicular unit connected to an end of the second horizontal unit and an end of the third horizontal unit at the second side, wherein
the first side and the second side are opposite to each other, and the first perpendicular unit and the second perpendicular unit are opposite to each other.

11. The thin film transistor display panel of claim 10, wherein the first perpendicular unit of the divided-voltage reference voltage line overlaps the first perpendicular stem of the first sub-pixel electrode or the first perpendicular stem of the second sub-pixel electrode, and the second perpendicular unit of the divided-voltage reference voltage line overlaps the second perpendicular stem of the first sub-pixel electrode or the second perpendicular stem to the second sub-pixel electrode.

12. The thin film transistor display panel of claim 1, wherein a portion of the storage electrode line in the first sub-pixel area has a square-like ring shape surrounding four sides of the first sub-pixel area.

13. The thin film transistor display panel of claim 12, wherein a portion of the storage electrode line in the second sub-pixel area has a shape substantially the same as a shape of the divided-voltage reference voltage line in the second sub-pixel area, the portion of the storage electrode line in the second sub-pixel area overlaps the divided-voltage reference voltage line in the second sub-pixel area, and the portion of the storage electrode line in the second sub-pixel area is electrically insulated from the divided-voltage reference voltage line in the second sub-pixel area.

14. The thin film transistor display panel of claim 1, further comprising:

a shield electrode disposed in a same layer as the first and second sub-pixel electrodes, wherein the shield electrode extends substantially in a perpendicular direction along the pixel area, and the shield electrode comprises:

a horizontal unit disposed between the first sub-pixel electrode and the second sub-pixel electrode and a perpendicular unit substantially perpendicular to the horizontal unit.

15. The thin film transistor display panel of claim 1, wherein four domains are defined in each of the first and second sub-pixel areas.

16. A liquid crystal display comprising:

a first substrate;

a gate line disposed on the first substrate;

a storage electrode line disposed on the first substrate;

a gate insulating layer disposed on the gate line;

a plurality of thin film transistors disposed on the gate insulating layer;

a divided-voltage reference voltage line disposed on gate insulating layer;

a passivation layer which covers the thin film transistors and the divided-voltage reference voltage line, wherein a first contact hole and a second contact hole are defined through the passivation layer;

a first sub-pixel electrode electrically connected to a first thin film transistor of the thin film transistors through the first contact hole, and comprising a plurality of pixel branch electrodes; and a second sub-pixel electrode electrically connected to a second thin film transistors of the thin film transistors through the second contact hole, and comprising a plurality of pixel branch electrodes, a second substrate disposed opposite to the first substrate;

a common electrode disposed on the second substrate; and a liquid crystal layer between the first substrate and the second substrate, wherein the first sub-pixel electrode comprises a first sub horizontal stem and a first sub perpendicular stem connected to an end of the first sub horizontal stem, the second sub-pixel electrode comprises a second sub horizontal stem and a second sub perpendicular stem connected to an end of the second sub horizontal stem, the divided-voltage reference voltage line comprises a horizontal unit and a perpendicular unit, and the perpendicular unit of the divided-voltage reference voltage line overlaps the first sub perpendicular stem of the first sub-pixel electrode and the second sub perpendicular stem of the second sub-pixel electrode.

17. The liquid crystal display of claim 16, wherein the first sub horizontal stem comprising a first horizontal stem and a second horizontal stem, the first horizontal stem and the second horizontal stem extending substantially in a horizontal direction, a plurality of minute branches extending in an oblique direction from the first and second horizontal stems, the minute branch extending from the first horizontal stem of the first sub-pixel electrode is connected to a minute branch extending from the second horizontal stem of the first sub-pixel electrode, and the minute branch extending toward the gate line from the second horizontal stem of the first sub-pixel electrode is connected to an expansion of the first sub-pixel electrode and receives a voltage from the first thin film transistor through the first contact hole, and the second sub horizontal stem comprising a first horizontal stem and a second horizontal stem, the first horizontal stem and the second horizontal stem extending substantially in a horizontal direction, a plurality of minute branches extending in an oblique direction from the first and second horizontal stems, the minute branch extending from the first horizontal stem of the second sub-pixel electrode is connected to a part of a minute branch extending from the second horizontal stem of the second sub-pixel electrode, and the minute branch extending toward the gate line from the first horizontal stem of the second sub-pixel electrode is connected to an expansion of the second sub-pixel electrode and receives the voltage from the second thin film transistor through the second contact hole.

18. The liquid crystal display of claim 16, wherein the first sub perpendicular stem comprising a first perpendicular stem and a second perpendicular stem, the first perpendicular stem substantially perpendicular to the first horizontal stem of the first sub-pixel electrode and connected to an end of the first horizontal stem of the first sub-pixel electrode, the second perpendicular stem substantially perpendicular to the second horizontal stem of the first sub-pixel electrode and connected to an end of the second horizontal stem of the first sub-pixel electrode, wherein position of the first perpendicular stem in the first sub-pixel area is opposite to a position of the second perpendicular stem in the first sub-pixel area, and the second sub perpendicular stem comprising a first perpendicular stem and a second perpendicular stem, the first perpendicular stem substantially perpendicular to the first horizontal stem of the second sub-pixel electrode and connected to an end of the first horizontal stem of the second sub-pixel electrode, the second perpendicular stem substantially perpendicular to the second horizontal stem of the second sub-pixel electrode and connected to an end of the second horizontal stem of the second sub-pixel electrode, wherein a position of the first perpendicular stem in the second sub-pixel area is opposite to a position of the second perpendicular stem in the second sub-pixel area.

19. The liquid crystal display of claim 16, further comprising:

a shield electrode disposed in a same layer as the first and second sub-pixel electrodes, wherein the shield electrode extends substantially in the perpendicular direction along the pixel area, and the shield electrode comprises:

a horizontal unit disposed between the first sub-pixel electrode and the second sub- pixel electrode, a perpendicular unit substantially perpendicular to the horizontal unit, and a black matrix which exposes the first and second sub-pixel areas and a region of the second substrate facing the shield electrode.

20. The liquid crystal display of claim 16, wherein:

the divided-voltage reference voltage line divides a first sub-pixel area in which the first sub-pixel electrode is provided into two regions and surrounds three sides in an individual region, and the divided-voltage reference voltage line divides a second sub-pixel area in which the second sub-pixel electrode is provided into two regions and surrounds three sides in an individual region.

* * * * *